United States Patent
Goto et al.

(10) Patent No.: US 10,504,956 B2
(45) Date of Patent: Dec. 10, 2019

(54) PHOTOGATE FOR FRONT-SIDE-ILLUMINATED INFRARED IMAGE SENSOR AND METHOD OF MANUFACTURING THE SAME

(71) Applicant: OmniVision Technologies, Inc., Santa Clara, CA (US)

(72) Inventors: Takayuki Goto, Foster City, CA (US); Dajiang Yang, San Jose, CA (US); Keiji Mabuchi, Los Altos, CA (US); Sohei Manabe, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 209 days.

(21) Appl. No.: 15/198,055

(22) Filed: Jun. 30, 2016

(65) Prior Publication Data
US 2018/0006076 A1    Jan. 4, 2018

(51) Int. Cl.
*H01L 27/146*    (2006.01)
*H01L 31/105*    (2006.01)
*H01L 31/113*    (2006.01)

(52) U.S. Cl.
CPC .. *H01L 27/14645* (2013.01); *H01L 27/14649* (2013.01); *H01L 31/105* (2013.01); *H01L 31/1136* (2013.01)

(58) Field of Classification Search
CPC .......... H01L 27/14645; H01L 31/1136; H01L 31/105; H01L 27/14649
See application file for complete search history.

(56) References Cited

U.S. PATENT DOCUMENTS

2006/0001059 A1*  1/2006  Mouli ............... H01L 27/14601
                                                     257/292
2006/0186322 A1*  8/2006  Matsuyama ...... H01L 27/14621
                                                     250/226

OTHER PUBLICATIONS

"IR/Color Composite Image Sensor with VIPS (Vertically Integrated Photodiode Structure)," by Jeong-Ho Lyu, et al. Miru Data System Co., Ltd., 2007 International Image Sensor Workshop, 2007.*

Fossum et al., "A Review of the Pinned Photodiode for CCD and CMOS Image Sensors", IEEE Journal of the Electron Devices Society, vol. 2, No. 3, May 2014.

(Continued)

*Primary Examiner* — Hrayr A Sayadian
(74) *Attorney, Agent, or Firm* — Larry E. Henneman, Jr.; Henneman & Associates, PLC

(57) ABSTRACT

An image sensor includes a substrate and a plurality of infrared pixels formed in a front side of the substrate and configured to detect infrared light incident on the front side of the substrate. Each of the infrared pixels includes a photodiode, a region free of implants located above the photodiode, and a photogate formed over the substrate and above the photodiode. The image sensor also includes a plurality of color pixels dispersed among the infrared pixels, where each of the color pixels includes a pinned photodiode and is configured to detect visible light. The photodiode of each of the infrared pixels can include a deep charge-accumulation region underlying the pinned photodiode(s) of one or more neighboring color pixel(s). Methods of manufacturing also described and include forming the deep charge-accumulation regions and associated elements prior to forming any implant-blocking elements (e.g., polysilicon photogates) over the substrate.

25 Claims, 16 Drawing Sheets

(56) References Cited

OTHER PUBLICATIONS

Mendis et al., "CMOS Active Pixel Image Sensor", IEEE Transactions on Electron Devices, vol. 41, No. 3, Mar. 1994.
Kim et al., "A 1.5Mpixel RGBZ CMOS Image Sensor for Simultaneous Color and Range Image Capture", 2012 IEEE International Solid-State Circuits Conference; Digest of Technical Papers, ISSCC 2012 / Session 22 / Image Sensors / 22.7, Feb. 22, 2012, pp. 392-394.
Author Unknown, "A New Photogate CMOS Image Sensor Structure With Improved Short Wavelength Response", Retrieved from www.paper.edu.cn/feature/downCount/415, publication date unknown, available prior to Jun. 30, 2016.
Lyu, Jeong-Ho, et al., "IR/Color Composite Image Sensor With VIPS (Vertically Integrated Photodiode Structure)", Miru Data System Co., Ltd., 2007 International Image Sensor Workshop, 2007.

\* cited by examiner

PHOTOGATE FOR FRONT-SIDE-ILLUMINATED INFRARED IMAGE SENSOR AND METHOD OF MANUFACTURING THE SAME

BACKGROUND OF THE INVENTION

Field of the Invention

This invention relates generally to image sensors that detect infrared light, and more particularly to a front-side-illuminated (FSI) image sensor that includes photogates for pixels that detect infrared light but not for pixels that detect visible light.

Description of the Background Art

Electronic image sensors are commonly incorporated into a variety of host devices including, for example, cell phones, computers, digital cameras, PDA's, etc. In addition to conventional user-controlled still and video camera applications, more and more image sensor applications are emerging. For example, integral machine vision applications are expanding rapidly in the automotive, manufacturing, medical, security, and defense industries. In such applications, machines perform certain operational tasks (e.g. collision prevention) based at least in part on information received from its image sensor(s). For the machine to properly perform its task, the image sensor should produce high-quality images.

Image sensors used in the above applications continue to become more complex to meet required demands. For example, the resolutions of image sensor arrays (their numbers of pixels) are constantly increasing. Additionally, image sensors now include both color pixels for detecting visible light and infrared pixels for detecting infrared light. These color and infrared pixels have different structural and performance requirements, which results in difficulties producing an image sensor that produces both high-quality color and infrared images.

For example, image sensors are made using complementary metal-oxide semiconductor (CMOS) technology, where a plurality of image sensor dies are fabricated in a semiconductor wafer. This fabrication process involves implanting or diffusing dopants into regions of the semiconductor substrate to form the integrated pixel circuitry. Unfortunately, the risk of poor-performing pixels increases as more implants are made, because the implantation equipment deposits metal contaminants (e.g., titanium (Ti), tungsten (W), etc.) in the substrate.

Excessive dark current is particularly problematic for infrared pixels, because infrared pixels are used to capture images in the dark. Dark current is the amount of electric current that flows through a photosensitive region of a pixel even when no photons are actually entering that pixel. Because too much dark current during charge accumulation will cause an over-exposed infrared pixel, it is desirable to minimize the amount of dark current present in the sensor array, particularly in infrared pixels. Metal contamination caused by ion implantation equipment is a major cause of dark current.

Another problem associated with image sensors is charge saturation. Charge saturation occurs when the amount of charge accumulated within a photodetector of a pixel during image capture reaches the maximum capacity of that photodetector. This maximum capacity is referred to as the "full well capacity". Early saturation of a photodetector is undesirable, because its sensitivity is reduced (e.g., it will indicate a full bright pixel earlier) compared to a photodetector that does not prematurely saturate. Dark current also contributes to early saturation. Thus, low well capacity and saturation can be problematic in infrared sensors used in dark environments, especially when too many bright pixels result in the final image.

Another difficulty with infrared pixel design results because infrared light is detected deep in the silicon substrate as compared to shorter wavelengths of (visible) light. Therefore, transferring the accumulated infrared charge from deep in the silicon substrate to read-out circuitry can be difficult for infrared pixels.

What is needed, therefore, is an image sensor that reduces dark current and improves infrared sensitivity in infrared pixels. What is also needed is an image sensor that improves the transfer of infrared signals to read-out circuitry. What is also needed is an image sensor that requires fewer ion implants.

SUMMARY

The present invention overcomes the problems associated with the prior art, by providing a front-side-illuminated image sensor that includes infrared pixels for detecting infrared light, where each infrared pixel includes a photogate formed over a light-sensitive region. The infrared pixels can also include deep infrared detecting regions that extend into one or more neighboring color pixel(s). The infrared pixel design of the invention reduces dark current, improves pixel sensitivity, and increases full-well capacity of the infrared pixels.

An image sensor according to the invention includes a substrate, a first plurality of pixels formed in the substrate, and a second plurality of pixels formed in the substrate. The first plurality of pixels and the second plurality of pixels are arranged to define a sensor array having a plurality of rows and a plurality of columns and where pixels of the second plurality are dispersed among pixels of the first plurality. Additionally, each pixel of the first plurality includes a photodetector of a first type configured to detect light in the visible spectrum, and each pixel of the second plurality includes a photodetector of a second type including a photogate and being configured to detect infrared light. The image sensor can be a front-side-illuminated (FSI) image sensor, where the first plurality of pixels and the second plurality of pixels are formed on a front side of the substrate, and where the first plurality of pixels and the second plurality of pixels detect light incident on the front side of the substrate.

The invention describes various embodiments for the photodetectors of the second type and the photodetectors of the first type. In one embodiment, the photodetector of the second type includes a photodiode formed in the substrate below the photogate. In another embodiment, the photogate can be formed from polysilicon and/or can be configured to diminish light in at least a portion of the visible spectrum. In still another embodiment, each photogate can be coupled to a voltage supply. Additionally, while the photodetector of the first type can include a pinned photodiode, the photodetector of the second type is free of any implants between the photodiode and the photogate. Thus, the photogate comprises a means for biasing a region of the substrate over a photodiode and for diminishing light in at least a portion of the visible spectrum.

In still another embodiment, a photodetector of the second type can further include a deep charge-accumulation region that can extend into at least one neighboring pixel of the first plurality and can be formed below the photodetector of the first type (the pinned photodiode) of the at least one neighboring pixel. A barrier region can also be formed above portions of the deep charge-accumulation region located in the at least one neighboring pixel of the first plurality.

Another image sensor according to the invention includes a substrate and a plurality of infrared pixels formed in a front side of the substrate and being configured to detect infrared light incident on the front side of the substrate. Each of the infrared pixels includes a photodiode, a region of the substrate free of implants located above the first photodiode, and a photogate formed over the substrate above the photodiode. In a particular embodiment, the image sensor also includes a plurality of color pixels dispersed among the infrared pixels, where each of the color pixels includes a pinned photodiode and is configured to detect visible light. Still more particularly, the photodiode of each of the infrared pixels can comprise a deep charge-accumulation region underlying the pinned photodiode associated with at least one neighboring color pixel.

A method for manufacturing an image sensor includes the steps of providing a substrate, forming a plurality of photodetectors of a first type in the substrate, where each of photodetectors of the first type is configured to detect visible light and is associated with one of a first plurality of pixels, and forming a plurality of photodetectors of a second type in the substrate, where each of the photodetectors of the second type is configured to detect infrared light and is associated with one of a second plurality of pixels. In this method, the step of forming the plurality of photodetectors of the second type also includes forming a plurality of photogates associated with the photodetectors of the second type. Particular methods can also include electrically coupling each of the plurality of photogates to a voltage supply, forming the photogate from polysilicon, and/or forming the photogates so that they are configured to diminish light in at least a portion of the visible spectrum. The image sensor can be a front-side-illuminated (FSI) image sensor, where the first plurality of pixels and the second plurality of pixels are formed in an array on a front side of the substrate and detect light incident on the front side of the substrate.

In a particular method, the step of forming the plurality of photodetectors of the second type includes, prior to the step of forming the plurality of photogates, forming a plurality of photodiodes in the substrate below locations where the photogates will be formed. More particularly, the step of forming the plurality of photodetectors of the first type includes forming a plurality of pinned photodiodes in the substrate, whereas the plurality of photodetectors of the second type are free of implants between the photodiodes and photogates.

In another particular method, the step of forming the plurality of photodetectors of the second type includes, prior to the step of forming the plurality of photogates, forming a plurality of deep charge-accumulation regions in the substrate below locations associated with the plurality of photogates. More particularly, the method includes forming the plurality of deep charge-accumulation regions prior to forming the photodetectors of the first type, where each deep charge-accumulation region extends into an area of the substrate associated with at least one neighboring pixel of the first plurality of pixels and is formed below locations in the substrate intended for the photodetectors of the first type. Still more particularly, the method can include forming a plurality of deep barrier regions in the substrate at locations above the plurality of deep charge-accumulation regions and below the locations in the substrate intended for the photodetectors of the first type. Thus, the steps of forming the plurality of deep charge-accumulation regions and forming the plurality of deep barrier regions are performed prior to forming any implant-blocking elements (e.g., photogates, transistors, etc.) over the substrate.

BRIEF DESCRIPTION OF THE DRAWINGS

The present invention is described with reference to the following drawings, wherein like reference numbers denote substantially similar elements.

DETAILED DESCRIPTION

The present invention overcomes the problems associated with the prior art, by providing a front-side-illuminated image sensor having infrared pixels, each of which includes a photogate that improves the pixel's performance, in part by reducing the number of substrate implants. The infrared pixels can also include a deep charge-accumulation region that underlies neighboring color pixel(s) and improves the sensitivity of the infrared pixels. In the following description, numerous specific details are set forth (e.g., particular types of doping, particular pixel layouts, etc.) in order to provide a thorough understanding of the invention. Those skilled in the art will recognize, however, that the invention may be practiced apart from these specific details. In other instances, details of well-known image sensor design and semiconductor fabrication practices (e.g., metallization, photo-masking, routine optimization, etc.) and components have been omitted, so as not to unnecessarily obscure the present invention.

Figure 1:
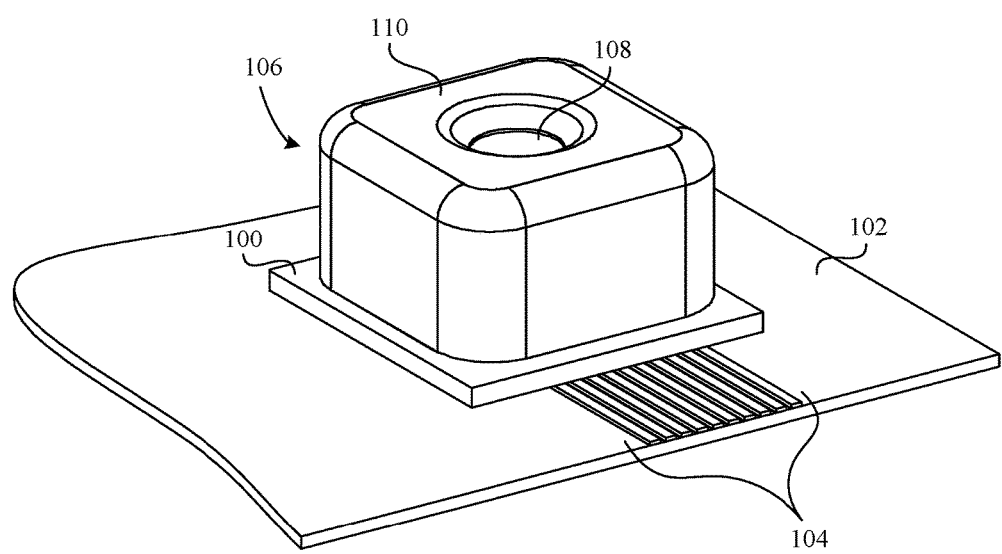
FIG. 1 is a perspective view of a camera module including an image sensor according to the present invention.

FIG. 1 is a perspective view of an image sensor 100 mounted on a portion of a printed circuit board (PCB) 102 that represents a PCB of a camera hosting device (e.g., automobile, manufacturing machine, medical device, cell phone, etc.). Image sensor 100 communicates electronically with other components of the hosting device via a plurality of conductive traces 104. In the example embodiment, image sensor 100 is depicted as being part of a camera module 106 that further includes an optical assembly 108 and a housing 110. As shown, housing 110 is mounted to image sensor 100 and optical assembly 108 is secured therebetween. Those skilled in the art will recognize that the particular designs and/or presence of PCB 102, traces 104, optical assembly 108, and housing 110 will depend on the particular application, and are not particularly relevant to the present invention. Therefore, PCB 102, traces 104, optical assembly 108, and housing 110 are representational in character only.

Figure 2:
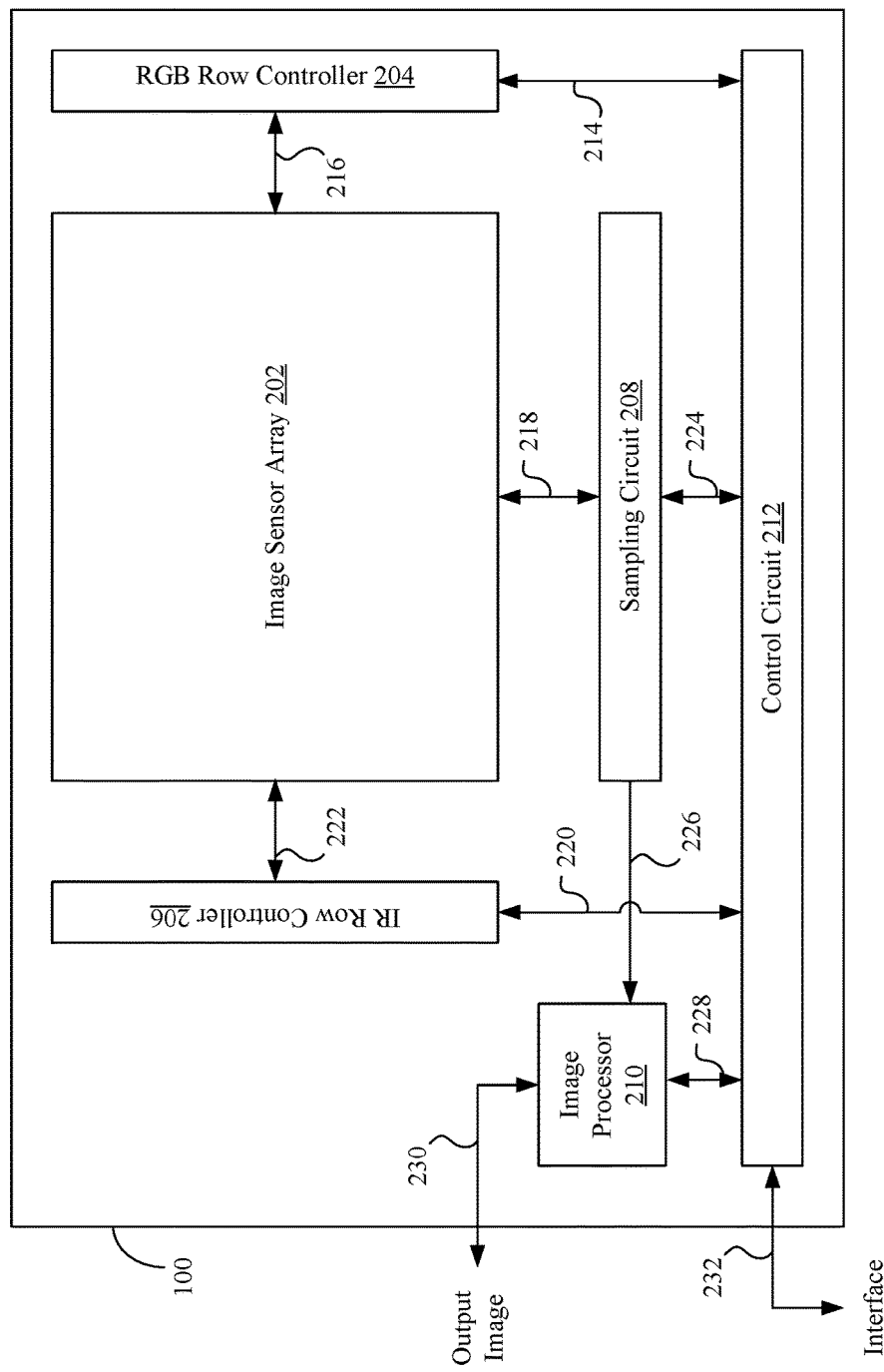
FIG. 2 is a block diagram showing the image sensor 100 of FIG. 1 in greater detail.

FIG. 2 is a block diagram showing image sensor 100 in greater detail. Image sensor 100 includes an image sensor array 202, a first (RGB) row controller 204, a second (IR) row controller 206, a sampling circuit 208, an image processor 210, and a control circuit 212. Image sensor array 202 is an array of photosensitive pixels and includes a first plurality of color pixels, which detect incident light in regions (e.g., red, green, and blue) of the visible spectrum, and a second plurality of infrared pixels, which detect incident light in the infrared spectrum.

RGB row controller 204 receives control signals from control circuit 212 via a first control bus 214 and, depending on those control signals, asserts row control signals onto a first row bus 216. First row bus 216, in turn, provides those row control signals to the color pixels of image sensor array 204. The row control signals asserted on first row bus 216 are operative to selectively cause each of the color pixels in a particular row to be reset, to accumulate a charge indicative of the intensity of incident light on that pixel over a charge accumulation (integration) time, and to assert an electrical signal indicative of the captured charge on an associated line of a column bus 218. Column bus 218, in turn, provides the intensity (image) data to sampling circuit 208.

Similarly, IR row controller 206 receives control signals from control circuit 212 via a second control bus 220 and, depending on those control signals, asserts row control signals onto a second row bus 222. Second row bus 222, in turn, provides those row control signals to the infrared pixels of image sensor array 204. The row control signals asserted on second row bus 222 are operative to selectively cause each of the infrared pixels in a particular row to be reset, to accumulate a charge indicative of the intensity of incident infrared light over a charge accumulation (integration) time, and to assert an electrical signal indicative of the captured charge on an associated line of a column bus 218. Advantageously, IR row controller 206 allows the infrared pixels of image sensor array 202 to be controlled separately from the color pixels.

Sampling circuit 208 performs sampling operations of the charges accumulated by pixels in image sensor array 202, on a row-by-row basis, according to column sampling instructions received from control circuit 212 via a control bus 224. When a particular row of pixels in image sensor array 202 is selected by one of RGB row controller 204 or IR row controller 206, sampling circuit 208 acquires digital data indicative of the electrical state of columns of pixels via column bus 218. Each time sampling circuit 208 acquires a row sample, it outputs digital data corresponding to the acquired row sample to image processor 210 via a data bus 226.

Image processor 210 receives and processes the digital image data acquired by sampling circuit 208 according to known image processing techniques and the control signals on control bus 228, to generate images desired by the host device. Also responsive to such control signals, image processor 210 provides output images to the host device via an output bus 230.

Control circuit 212 provides overall coordination and control of the various components of image sensor 100, including any control routines utilized during image capture. As shown, control circuit 212 includes an interface 232 to the host device, so that the host device can control image sensor 100 according to its needs (e.g., select color image capture, select infrared image capture, etc.).

Figure 3A:
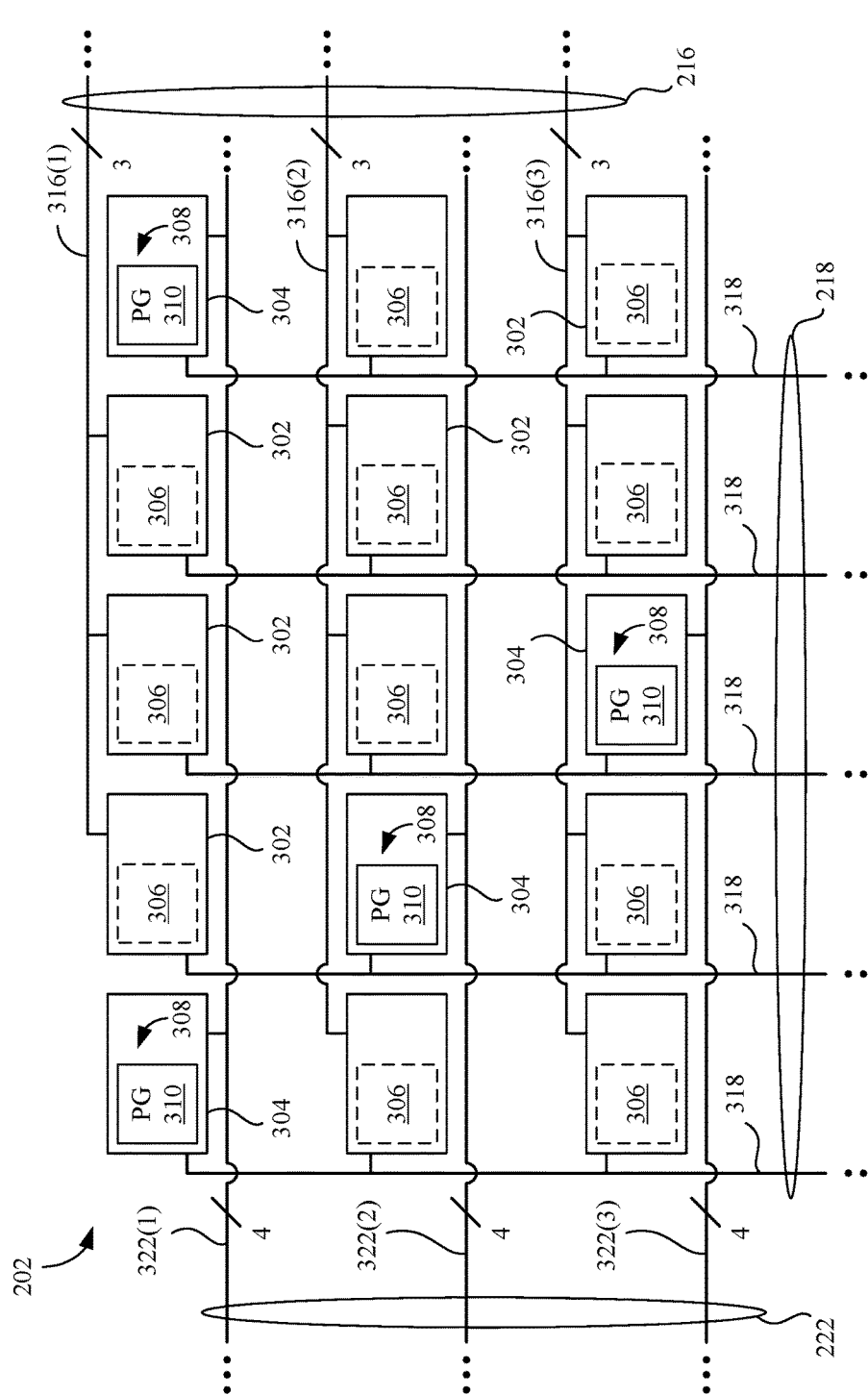
FIG. 3A is a schematic showing a portion of the image sensor array of FIG. 2 in greater detail.

FIG. 3A is a schematic showing a portion of image sensor array 202 in greater detail. As shown, image sensor array 202 includes a first plurality of color pixels 302, each configured to detect light in a particular region (e.g., red, green, or blue) of the visible spectrum, and a second plurality of infrared pixels 304, each configured to detect light in the infrared spectrum. The infrared pixels 304 are dispersed among the color pixels 302 within image sensor array 202 according to some predetermined scheme. The pixels 302 and 304 are shown spaced apart for clarity in FIG. 3A, but those skilled in the art will understand that pixels 302 and 304 could be formed contiguously in the substrate.

Each of color pixels 302 includes a first type of photodetector 306 formed therein, which in this embodiment includes a pinned photodiode. The pinned photodiode defines a light-receiving area (shown in long dashes) for the associated color pixel 302. In contrast, each of infrared pixels 304 includes a second type of photodetector 308, which is structurally different from the first type of photodetector 306. As explained later, the second type of photodetector 308 includes a photodiode formed in the substrate (FIG. 8) and a photogate 310 formed over the substrate and above the photodiode. The photogate 310 is formed from a conductive material such as polysilicon.

The color pixels 302 contained in a row of array 202 are controlled by an associated set of row control lines 316. Only three sets of row control lines 316(1-3) for the first three rows of color pixels 302, respectively, are shown in FIG. 3A. However, it will be understood that image sensor array 202 will include a set of row control lines 316 for each row in image sensor array 202 that includes color pixels 302. Together, the sets of row control lines 316(1-$n$) form row bus 216, where n represents the number of rows in the image sensor array 202 that contain color pixels 302. In the present embodiment, each set of row control lines 316 includes three control lines. Control signals asserted on a set of row control lines 316 by RGB row controller 204 cause the color pixels 302 in the associated row to carry out their intended image capture functions. When instructed by such control signals, each color pixel 302 of a selected row outputs an electrical signal indicative of its detected intensity on a respective column line 318 of column bus 218. Column bus 218 includes a column line 318 for each column of pixels.

The infrared pixels 304 contained in a row of array 202 are controlled separately from the color pixels 302 via an associated set of row control lines 322. FIG. 3A shows only three sets of row control lines 322(1-3), which provide control signals to the first three rows of infrared pixels 304 in array 202, respectively. However, it will be understood that a set of row control lines 322 will be provided for each row in array 202 that includes infrared pixels 304. Together, the sets of row control lines 322(1-$m$) form row bus 222, where m represents the number of rows in array 202 that contain infrared pixels 304. Depending on the embodiment, m might be the same or different than the number of rows containing color pixels 302, n. In the present embodiment, each set of row control lines 322 includes four control lines, as will be described in more detail later. Control signals asserted on row control lines 322 by IR row controller 206 cause the infrared pixels 304 in the associated row to carry out their intended image capture functions. When instructed by such control signals, each infrared pixel 304 of a selected row outputs an electrical signal indicative of its detected intensity on a respective column line 318 of column bus 218. Optionally, column bus 218 may include dedicated column lines 318 for color pixels 302 and infrared pixels 304.

Figure 3B:
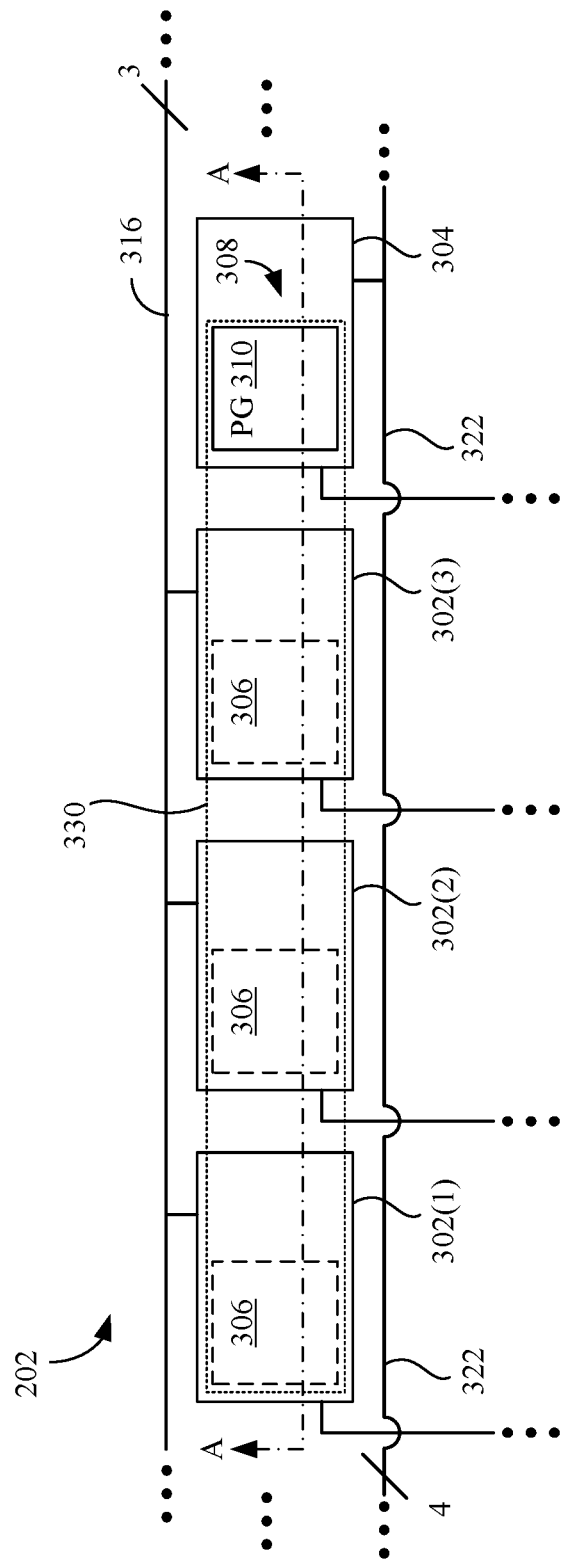
FIG. 3B shows a portion of the schematic of FIG. 3A in still greater detail.

FIG. 3B shows a region of array 202 in even greater detail, according to a particular embodiment of the invention. In FIG. 3B, the second type of photodetector 308 of each infrared pixel 304 is shown to further include a deep charge-accumulation region 330 (shown in short dashes) that underlies the photogate 310 of the infrared pixel 304 and the photodetector 306 (pinned photodiode) of at least one neighboring color pixel 302. Here, deep charge-accumulation region 330 underlies three neighboring color pixels 302(1-3) but, in other embodiments, might underlie fewer (e.g., one) or more neighboring color pixel(s) 302. Additionally, in this embodiment, some or all of the color pixels 302 can include barrier regions below their pinned photodiode to block charge carriers generated by the deep charge-accumulation region 330 as will be described in more detail below.

As is understood by those skilled in the art, infrared wavelengths of light (e.g., those of 750 nm and above) are absorbed relatively deeply in silicon, as compared to the visible spectrum, which is absorbed at shallower depths. Therefore, deep charge-accumulation region 330 can underlie the photodiodes 306 of the neighboring color pixels 302 for the purpose of detecting more infrared light, without interfering with visible light detection. Accordingly, the deep charge-accumulation region 330 improves the full-well capacity of an infrared pixel 304, by increasing the volume of the substrate that is sensitive to infrared light for that infrared pixel 304. Because the full well capacity is increased, risk of pixel saturation is reduced and pixel sensitivity is improved.

FIGS. 4A-4D show exemplary arrangements of color pixels 302 and infrared pixels 304 that can be used within image sensor array 202. Only portions of an array are shown in each of FIGS. 4A-4D. Accordingly, those skilled in the art will realize that the illustrated pixel arrangements will be repeated many more times throughout the full array.

Figure 4A:
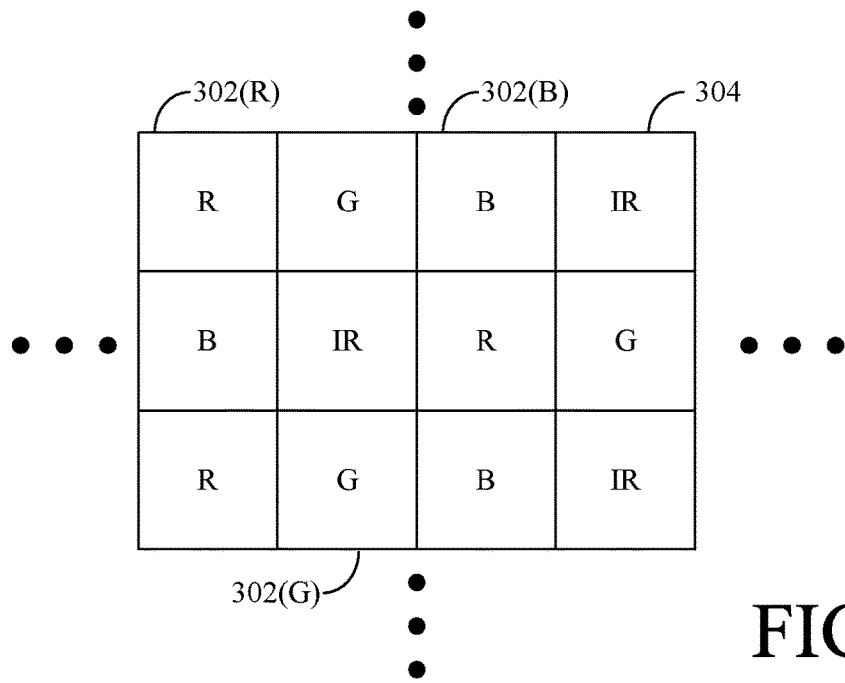
FIGS. 4A-4D show exemplary arrangements of color and infrared pixels possible within an image sensor array according to the invention.
Figure 4B:
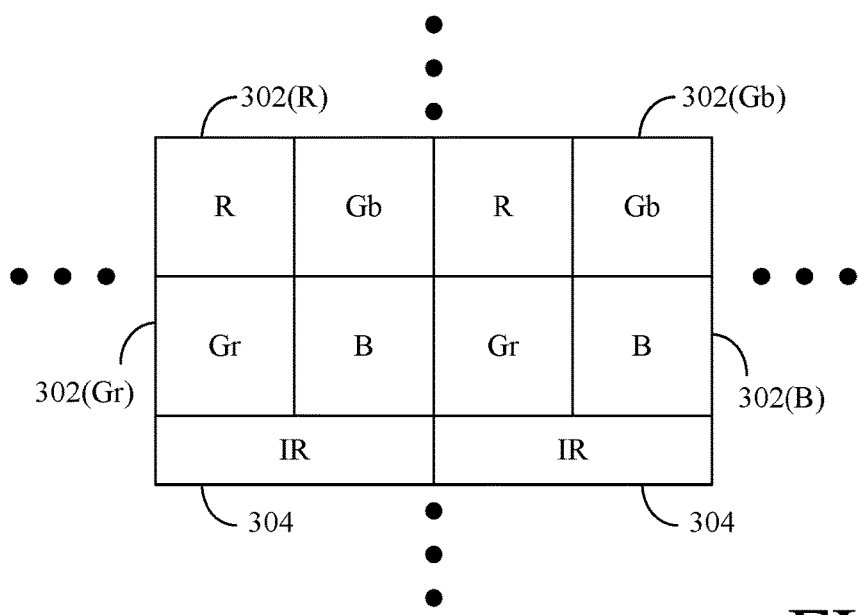
Figures 4C, 4D:
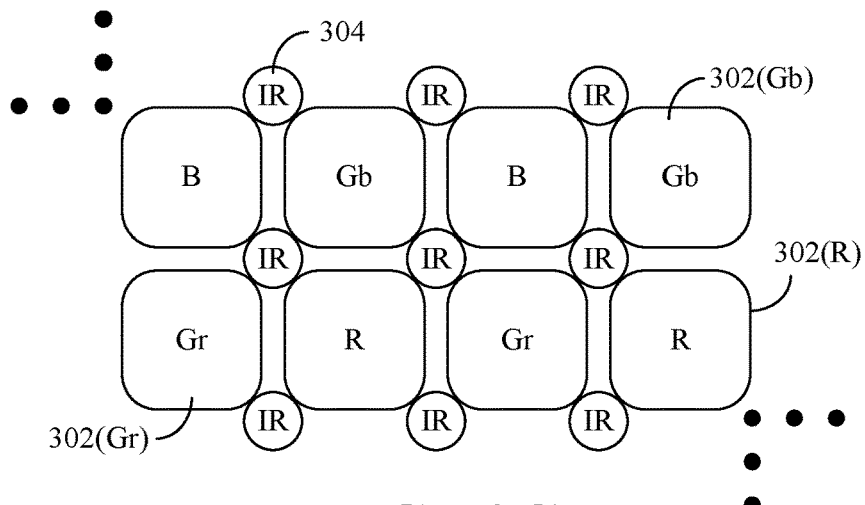

FIG. 4A shows infrared pixels 304 interspersed between red-sensitive pixels 302(R), green-sensitive pixels 302(G), and blue-sensitive pixels 302(B), where pixels 302(R), 302(G), and 302(B) are configured (e.g., with appropriate color filters, not shown) to detect visible light in the red, green, and blue regions of the visible spectrum, respectively. FIG. 4B shows color pixels 302 and infrared pixels 304 arranged in different rows of the sensor array and infrared pixels 304 that are rectangular in shape. Additionally, color pixels 302 in FIG. 4B include two types of green-color pixels where one type, 302(Gr), is sensitive to green light near the red end of the visible spectrum and a second type, 302(Gb), is sensitive to green light near the blue end of the spectrum. FIG. 4C shows an embodiment where infrared pixels 304 have their centers located between adjacent rows and adjacent columns of four surrounding color pixels 302. FIG. 4D shows an embodiment where the arrangement of infrared pixels 304 forms diagonals within the pixel array.

Indeed, many different arrangements and configurations of color pixels 302 and infrared pixels 304 are possible. Additionally, while the description of the present invention is made with respect to an image sensor array that includes both color pixels 302 and infrared pixels 304, it should be understood that many embodiments of the present invention are also applicable to an image sensor array that includes only infrared pixels 304.

Figure 5:
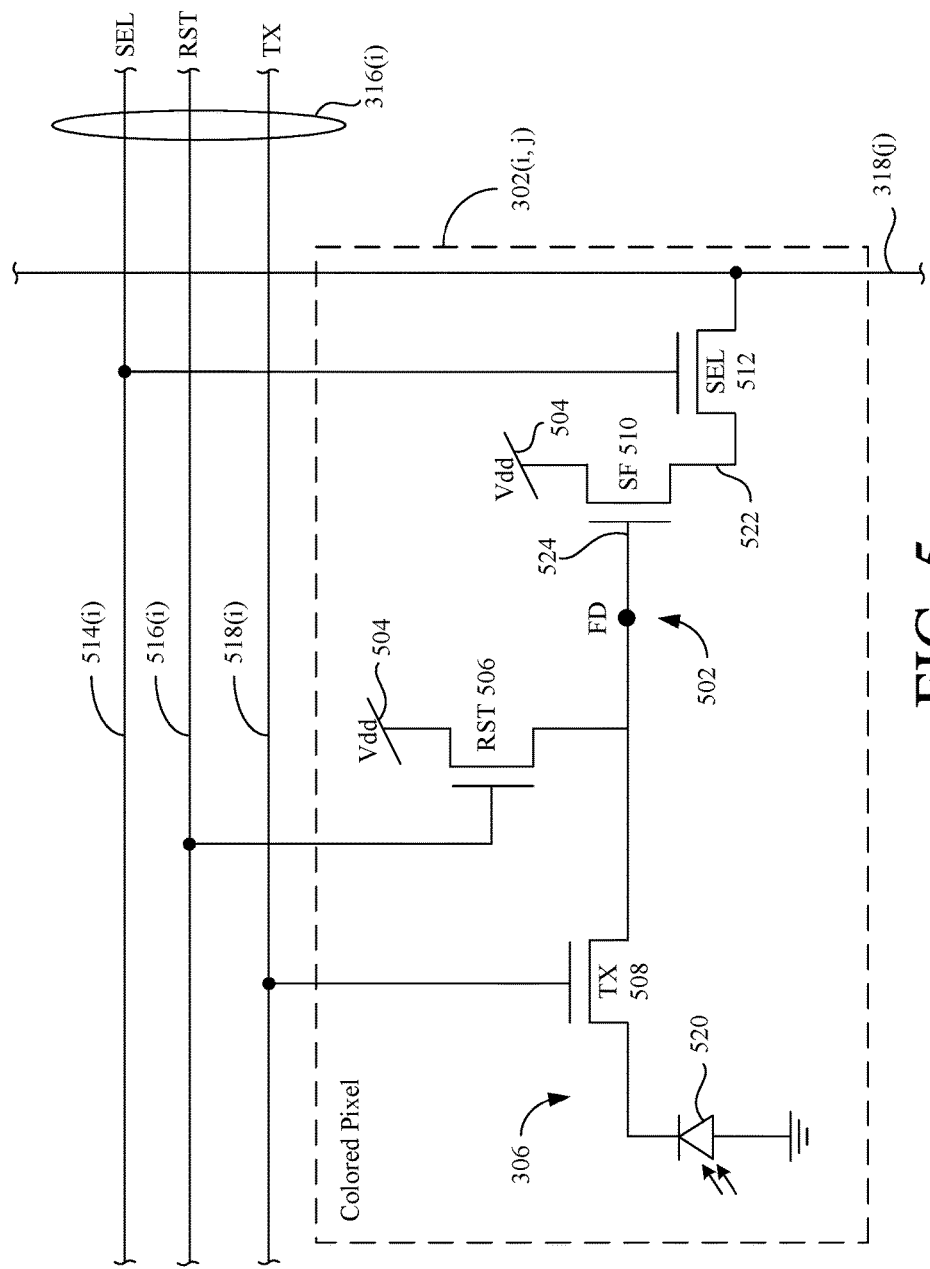
FIG. 5 is a schematic of a color pixel according to an embodiment of the invention.

FIG. 5 is a schematic of a color pixel 302($i, j$), located in an $i^{th}$ row and $j^{th}$ column of image sensor array 202, according to an exemplary embodiment of the invention. In this example, color pixel 302($i, j$) is a four-transistor (4T) pixel that includes a first type of photodetector 306, a floating diffusion region 502, a pixel voltage source terminal ($V_{dd}$) 504, a reset (RST) transistor 506, a transfer (TX) transistor 508, a source-follower (SF) transistor 510, and a row select (SEL) transistor 512. Additionally, a set of row control lines 316($i$) for the $i^{th}$ row is shown in greater detail to include a row select (SEL) line 514($i$) coupled to the gate of row select transistor 512, a reset (RST) line 516($i$) coupled to the gate of reset transistor 506, and a transfer (TX) line 518($i$) coupled to the gate of transfer transistor 508.

The circuitry of color pixel 302($i, j$) functions as follows. Photodetector 306 includes a pinned photodiode 520 and is operative to convert incident light into electrical charge. Floating diffusion region 502 is operative to store charge generated by photodiode 502. Voltage source terminal 504 provides a voltage to both reset transistor 506 and source follower transistor 510. When RGB row controller 204 asserts a reset signal (e.g., a digital high voltage) on the gate terminal of reset transistor 506 via reset line 516($i$), reset transistor 506 is temporarily placed into a conducting state whereby floating diffusion region 502 is coupled to voltage source terminal 504. As a result, the previous charge state of floating diffusion region 502 is reset to a known reference charge state. Once reset line 516($i$) is returned to a low voltage state, reset transistor 506 turns off (becomes non-conducting) and floating diffusion region 502 is electrically isolated from voltage source terminal 504.

Transfer transistor 508 includes a first terminal coupled to photodiode 502, a second terminal coupled to floating diffusion region 502, and a gate coupled to transfer line 518($i$). When first row controller 204 asserts a transfer signal (e.g., a digital high voltage) on transfer gate 508 via transfer line 518($i$), transfer transistor 508 is placed into a conducting state whereby photodiode 502 is coupled to floating diffusion region 502. As a result, the charge generated by photodiode 502 is transferred to floating diffusion region 502, where such charge indicates the intensity of light incident on the photodiode 502. Thereafter, when transfer line 518($i$) is returned to a low voltage state, transfer transistor 508 turns off such that floating diffusion region 502 is electrically isolated from photodiode 502.

Source-follower transistor 510 includes a first terminal coupled to voltage source terminal 504, a second terminal 522 coupled to row select transistor 512, and a gate terminal 524 coupled to floating diffusion region 502. Those skilled in the art will recognize that the electrical state of second terminal 522 is dictated by the charge state of gate terminal 524 and, therefore, the charge state of floating diffusion region 502. Accordingly, terminal 522 may function as an output terminal of pixel 302, which is operative to output an electrical signal indicative of the charge stored in floating diffusion region 502 and the intensity of light detected by the pixel.

Row select transistor 512 includes a first terminal coupled to terminal 522 of source-follower transistor 510, a second terminal coupled to a column line 318($j$) associated with the $j^{th}$ column of array 202, and a gate terminal coupled to row select line 514($i$). When first row controller 204 asserts a row select signal (e.g., a digital high voltage) on row select line 514(i), row select transistor 512 conducts, which results in the signal from terminal 522 being asserted onto column line 318(j). Column line 318(j) provides the output signal from pixel 302(i, j) to sampling circuit 208, which buffers the signal, converts it to digital image data, and provides the digital image data to image processor 210 (FIG. 2) for further processing. Otherwise, row select transistor 512 is in an open state when a row select signal is not being asserted on row select line 514(i), thus disconnecting the output terminal 520 of pixel 302(i, j) from column line 318(j).

Figure 6:
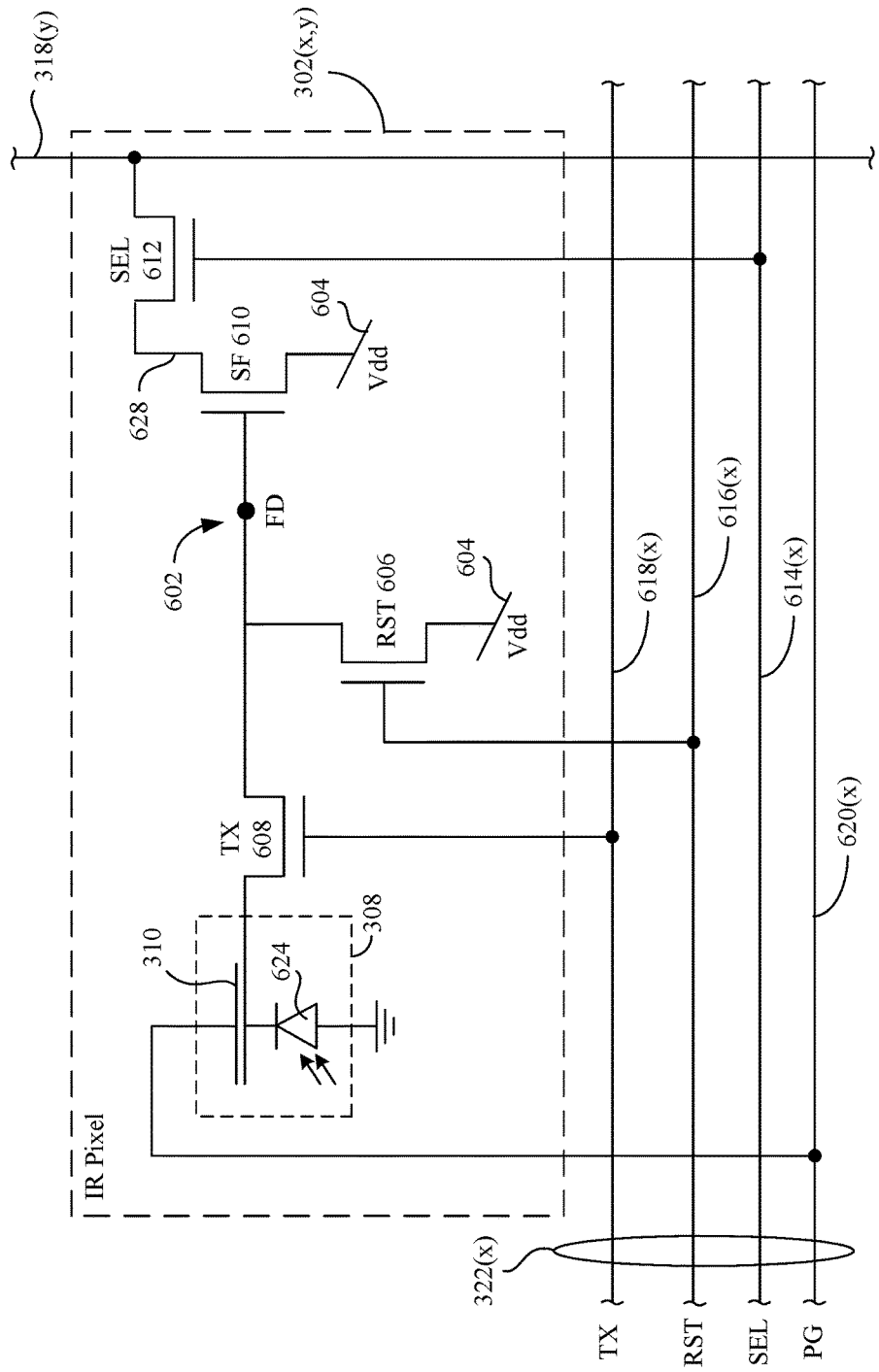
FIG. 6 is a schematic of an infrared pixel according to an embodiment of the invention.

FIG. 6 is a schematic of an infrared pixel 302(x, y), located in an $x^{th}$ row and $y^{th}$ column of image sensor array 202, according to an exemplary embodiment of the invention. In this example, infrared pixel 304(x, y) is a four-transistor (4T) pixel that includes a second type of photodetector 308, a floating diffusion region 602, a pixel voltage source terminal ($V_{dd}$) 604, a reset (RST) transistor 606, a transfer (TX) transistor 608, a source-follower (SF) transistor 610, and a row select (SEL) transistor 612. Additionally, a set of row control lines 322(x) from IR row decoder 206 for controlling the $x^{th}$ row of infrared pixels 304 is shown in greater detail to include a row select (SEL) line 614(x) coupled to the gate of row select transistor 612, a reset (RST) line 616(x) coupled to the gate of reset transistor 606, a transfer (TX) line 618(x) coupled to the gate of transfer transistor 608, and a photogate line 620(x) coupled to the photogate 310 of photodetector 308.

In addition to photogate 310, the second type of photodetector 308 includes a photodiode 624 that has charge-accumulation regions (FIG. 8) that underlie photogate 310, including a deep charge-accumulation region corresponding to deep charge-accumulation region 330 of FIG. 3B. Photodiode 624 is configured to convert incident infrared light into an amount of electrical charge indicative of the intensity of incident infrared light on photodiode 624. Photogate 310 is coupled to photogate line 620(x), so as to have a range of voltages applied thereto by IR row controller 206. As will be described in more detail below, voltages can be applied to photogate 310 to create a pinning effect for photodiode 624 (without the need for a pinning implant), to improve the full well capacity of photodiode 624, and to improve IR signal transfer (reduce lag) to floating diffusion region 602. Because pinning implants are not required, dark current and occurrences of pixel saturation (over-exposed pixels) are also reduced.

The remaining elements of infrared pixel 304 function similarly to the corresponding elements of color pixel 302 described above and, therefore, will not be described in significant detail. For example, floating diffusion region 602 is operative to store charge generated by photodiode 624. Voltage source terminal 604 provides a voltage (Vdd) to both reset transistor 506 and source follower transistor 510. Responsive to a reset signal received via reset line 616(x) from IR row controller 206, reset transistor 606 conducts and resets floating diffusion region 602 to a known reference charge state. Once the reset signal is removed from reset line 616(x), reset transistor 606 turns off and floating diffusion region 602 is electrically isolated from voltage source terminal 604. When IR row controller 206 asserts a transfer signal on transfer line 618(x), transfer transistor 608 conducts, and the charge generated by photodetector 624 is transferred to floating diffusion region 602. Thereafter, when the transfer signal is removed from transfer line 618(x), transfer transistor 608 turns off such that floating diffusion region 602 is electrically isolated from photodetector 308. Source-follower transistor 610 outputs an electrical signal on an output terminal 628, where the electrical signal depends on the charge of floating diffusion region 602 and is indicative of the charge stored in floating diffusion region 602. This output signal is provided to column line 318(y), responsive to IR row controller 206 enabling select transistor 612 via row select line 614(x). Column line 318(y) provides the output signal from pixel 304(x,y) to sampling circuit 208, which buffers the signal, and converts it to digital image data.

Figure 7:
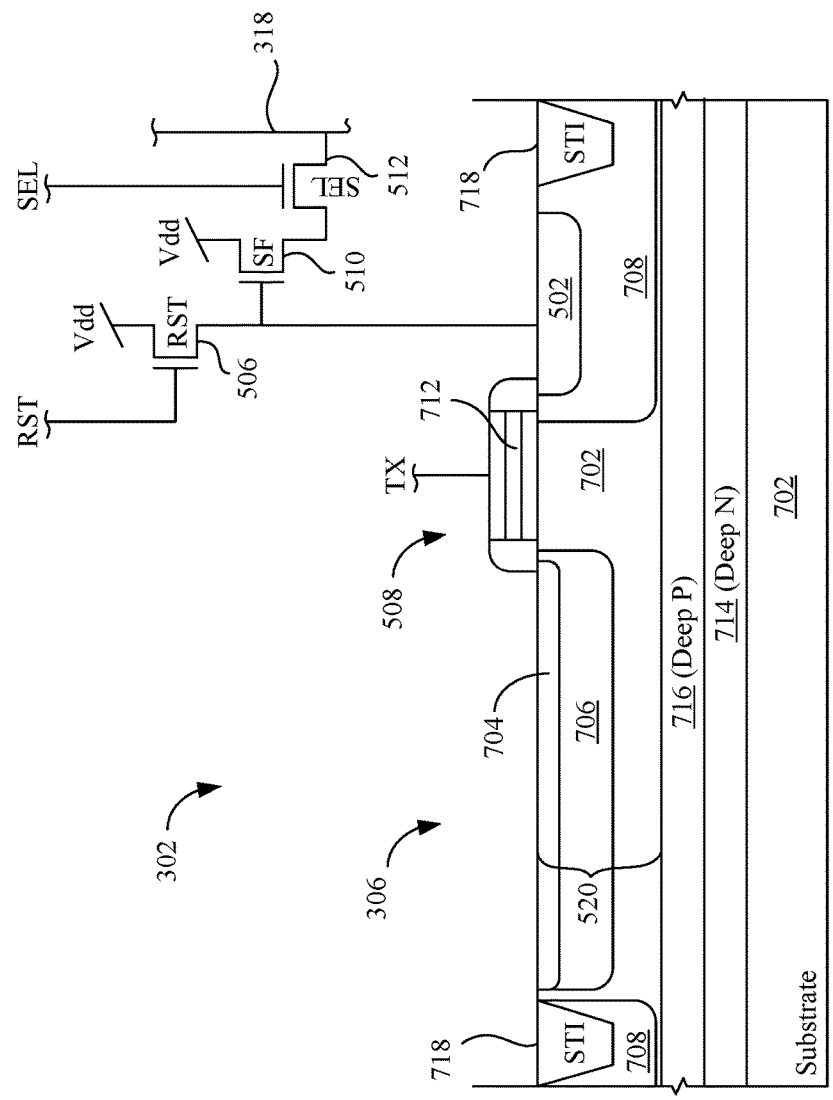
FIG. 7 is a cross-sectional view of a color pixel according to an embodiment of the invention.

FIG. 7 is a cross-sectional view of a color pixel 302 taken along section line A-A of FIG. 3B, according to an embodiment of the invention. As shown, pixel 302 is formed in a p-type silicon substrate 702 and includes a first type of photodetector 306 for detecting light in the visible spectrum as described above. In this embodiment, photodetector 306 is a pinned photodiode 520 defined by a p+ type pinning region 704 formed over an (n−) type charge-accumulation region 706. Both of regions 704 and 706 are formed in substrate 702, which has a (p−) type structure. Alternatively, substrate 702 could be a (p−) type epitaxial layer grown on a substrate 702. Charge-accumulation region 706 is formed at a depth in silicon substrate 702 that is sensitive to visible light.

Color pixel 302 further includes a floating diffusion region 502, which has an n-type (e.g., n+) structure, that is formed in a p-well 708 Charge generated from light in charge-accumulation region 706 is transferred to floating diffusion region 502 when a transfer signal (TX) is asserted on transfer transistor 508. Transfer transistor 508 includes a polysilicon layer 712 as part of its gate stack and is formed using methods known in the art. Similarly, reset transistor 506, source follower transistor 510, select transistor 512, and column line 318 are formed on substrate 702 using methods known in the art, but are shown only in schematic form in FIG. 7 for simplicity.

A deep charge-accumulation region 714 that is associated with a nearby infrared pixel 304 is also formed deep in silicon substrate 702 under pinned photodiode 520. Deep charge-accumulation region 714 corresponds with deep charge-accumulation region 330 shown in FIG. 3B and forms part of the photodiode 624 of a nearby infrared pixel 304. Deep charge-accumulation region 714 is formed at a depth (e.g., 3.0-6.0 micrometers) where infrared light is absorbed and, in this embodiment, has an n-type structure. Additionally, a deep p-type barrier region 716 is formed over deep charge-accumulation region 714 (e.g., near a depth of 3.0 micrometers). Barrier region 716 prevents charge carriers produced in deep charge-accumulation region 714 responsive to infrared light from migrating toward pinned photodiode 520 of color pixel 302. Because infrared pixels 304 having deep charge-accumulation regions 330 are optional, regions 714 and 716 are also optional.

The horizontal limits of color pixel 302 are generally defined by the left-hand and right-hand isolation regions 718, which are formed by shallow trench isolation (STI) or ion implantation. In this example, the left-hand isolation region 718 is formed in a p-well 708 that is shared with an adjacent color pixel 302. Similarly, the right-hand isolation region 718 is formed in the same p-well 708 as floating diffusion region 502, where such p-well 708 extends into an adjacent color pixel 302 or infrared pixel 304.

The p-type and n-type regions discussed herein are formed using known doping techniques, such as ion implantation or diffusion. For example, the n-type regions 706, 714, and 502 can be formed by implanting substrate 702 with an n-type dopant, such as arsenic (As), phosphorous (P), etc., at the appropriate concentrations and depths. Similarly, the p-type regions 704, 708, and 716 can be formed by implanting substrate 702 with a p-type dopant, such as Boron (B), $BF_2$ molecules, etc., at the appropriate concentrations and depths. As another example, substrate 702 could be a p-type epitaxial layer grown on a silicon substrate, and the regions discussed above can be formed in the p-type epitaxial layer 702.

Figure 8:
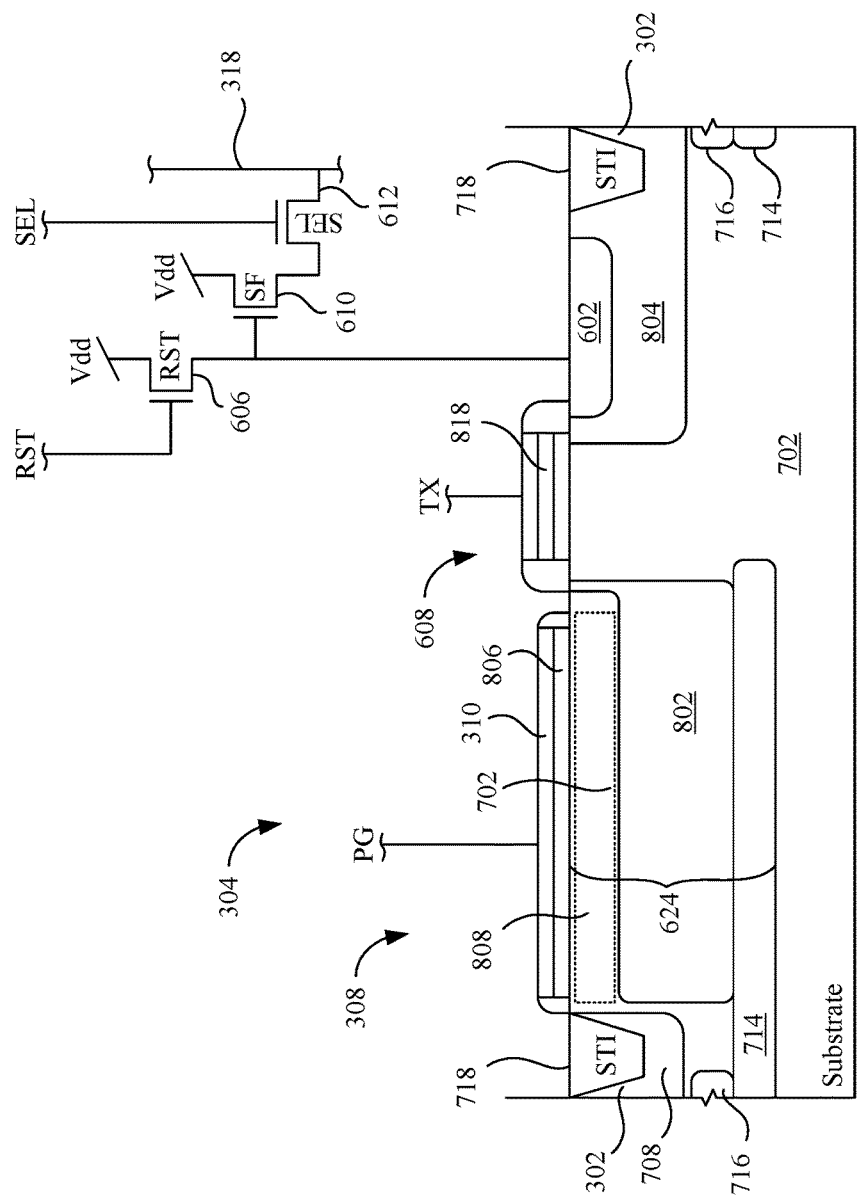
FIG. 8 is a cross-sectional view of an infrared pixel according to an embodiment of the invention.

FIG. 8 is a cross-sectional view of an infrared pixel 304 taken along section line A-A of FIG. 3B. Infrared pixel 304 is formed in p-type silicon substrate 702 and has a second type of photodetector 308, which includes photogate 310 and first photodiode 624. Photodiode 624 is formed by a first n-type charge-accumulation region 802 and deep charge-accumulation region 714, which are both formed in p-type substrate 702. Additionally, a floating diffusion region 602 of infrared pixel 304, which has n-type doping (e.g., n+) like floating diffusion region 502, is formed in a p-type well 804. Reset transistor 606, transfer transistor 608, source follower transistor 610, select transistor 612, and column line 318 are also formed on substrate 702 using methods known in the art.

The horizontal limits of infrared pixel 304 are also defined by left- and right-hand isolation regions 718. As shown, p-well 804 extends under right-hand isolation region 718 and into a neighboring color pixel 302. Additionally, a p-well 708 from a neighboring color pixel 302 is shared with pixel 304 and surrounds the left-hand isolation region 718.

Deep charge-accumulation region 714 extends from the bottom of charge-accumulation region 802 into neighboring a color pixel 302 under the left-hand isolation region 718. (The deep charge-accumulation region 714 shown under the right-hand isolation region 718 is associated with a different infrared pixel 304.) Because deep charge-accumulation region 714 is in contact with charge-accumulation region 802, charge carriers (electrons in this example) in deep charge-accumulation region 714 migrate into charge-accumulation region 802. The charge carriers from region 714 combine with charge carriers (electrons) generated in charge-accumulation region 802, and the combined charge carriers are then transferred from charge-accumulation region 802 to floating diffusion region 602 via activation of transfer transistor 608. Thus, infrared pixel 304 enlists nearby color pixel(s) 302 for infrared charge generation and accumulation purposes using deep charge-accumulation region 714, thereby increasing the full well capacity of infrared pixel 304. FIG. 8 also illustrates shows that the barrier regions 716 of the neighboring color pixels 302 do not extend into infrared pixel 304, but instead terminate near isolation regions 718.

Charge accumulation region 802 begins at a depth of approximately 0.05 micrometers and can extend down to a depth in the range of 3.0 to 6.0 micrometers, which in the embodiment shown in FIG. 8, enables charge-accumulation region 802 to join with deep charge-accumulation region 714. In other embodiments, such as one omitting a deep charge-accumulation region 714, charge accumulation region 802 can begin at a depth of approximately 0.05 micrometers and extend to a depth of approximately 0.15 micrometers so as to have a thickness of approximately 0.10 micrometers. In still another embodiment, charge accumulation region 802 can be formed at approximately 0.05 to 0.15 micrometers deep (for a thickness of approximately 0.10 micrometers), and deep charge-accumulation region 714 can project upward within pixel 304 to join charge-accumulation region 802 at a depth near 0.15 micrometers. Indeed, various embodiments are possible.

Unlike pinned photodiode 520, photodetector 308 does not include a pinning implant above charge-accumulation region 802. Rather, photodetector 308 includes a photogate 310, which is formed over the surface of substrate 702 above charge-accumulation region 802 and deep charge-accumulation region 714. According to the invention, photogate 310 is formed from a conductive material and at a thickness that diminishes (e.g., blocks, absorbs, spectrally shifts, etc.) light in at least part of the visible spectrum. For example, forming photogate 310 from polysilicon at a thickness in the range of 90-300 nm provides the desired light-diminishing effect on at least part of the visible spectrum (e.g., at least portions toward the blue end), while still passing infrared wavelengths very well. In a particular embodiment, a photogate 310 formed from polysilicon at a thickness of approximately 100 nm is used. Accordingly, photogate 310 improves the sensitivity of infrared pixel 304 by diminishing charge generated from visible wavelengths of light in the substrate.

Photogate 310 covers all or most of the area of charge-accumulation region 802 into and out of the plane of the page. An insulating layer 806 isolates a region 808 of substrate 702 over charge-accumulation region 802 from a voltage (PG) applied to photogate 310, but still allows photogate 310 to bias the region 808. In the embodiment shown in FIG. 8, region 808 is approximately 0.05 micrometers deep from the surface of substrate 202 down to charge accumulation region 802. Insulating layer 806 can be formed from an oxide, such as $SiO_2$, or some other dielectric insulating material. Techniques for depositing silicon and polysilicon on semiconductor wafers are well known and, therefore, will not be discussed in great detail herein. However, it could be desirable to form a polysilicon layer 818 of the gate stack of transfer transistor 608 when forming photogate 310.

Photogate 310 is coupled to a voltage source of IR row controller 206 (FIG. 2) via an associated photogate line 620 (FIG. 6). IR row controller 206 can apply a range of voltage potentials to photogate 310 to improve the efficiency and sensitivity of infrared pixel 304. For example, applying a negative voltage to photogate 310 causes photogate 310 to bias region 808 such that region 808 functions as a pinning region for photodiode 624. More particularly, when incident infrared light is absorbed, creating positive and negative charge carriers, a negatively-biased region 808 attracts and accumulates the positive charge carriers (the holes) and the accumulation region 802 accumulates the negative charge carriers (the electrons). This effect, in turn, increases the ability of charge-accumulation region 802 to store electrons and, therefore, increases its full well capacity. Because infrared pixel 304 has increased full well capacity, both due to photogate 310 and deep charge-accumulation region 714, the risk of infrared pixel 304 saturating and causing over-exposed (white) pixels is reduced.

The voltage potential (PG) applied to photogate 310 is important for creating the desired pinning effect in region 808 of substrate 702. The inventors have found that applying voltages in the range of negative 1.0V to negative 1.4V, inclusive, cause the desired pinning effect in region 808 with a potential of negative 1.0V being particularly useful in some embodiments. However, a potential of negative 0.5V has been found to be too weak to create the desired pinning effect, because charge-accumulation regions 802 and 714 are formed deeply in silicon substrate 702 to detect the infrared signal. Furthermore, the inventors have found that a potential of negative 2.0V is too strong and will cause problems.

Biasing the region 808 in the above manner has the effect of a pinning implant (e.g., a p+ type implant) for photodiode 624, but without requiring such an implant to be formed in the substrate 702 over region 802. Therefore, metal contamination caused by ion implantation equipment is reduced for infrared pixel 304 as compared to an infrared pixel having such a pinning implant. Reducing this metal contamination reduces the amount of unwanted dark current generated in the photodiode 624, which improves the accuracy of the detected infrared signal and reduces the risk of saturating photodiode 624.

As mentioned above, the voltage applied to photogate 310 can be controlled very flexibly over a wide range (e.g., −1.4V to positive Vdd, etc.). In addition to providing the above advantages, this ability also enables the application of different voltage(s) to photogate 310 to improve charge transfer to floating diffusion region 602, thus greatly reducing or eliminating signal lag (the charge that remains in charge-accumulation regions 802 and 714 after transfer) in photodiode 624. IR row controller 206 can also control the voltage on transfer transistor 608 via transfer line 618 to further bias substrate 702 and/or to improve charge transfer to floating diffusion region 602.

Figure 9A:
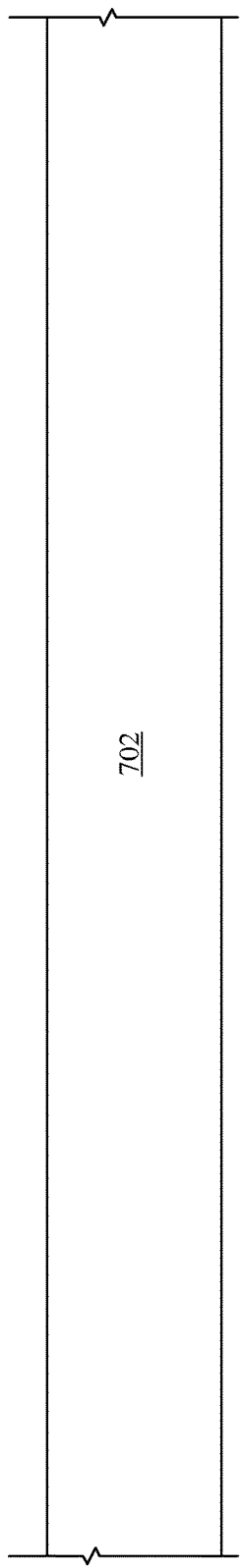
FIGS. 9A-9H illustrate the steps in a process for manufacturing an image sensor according to the present invention.
Figure 9B:
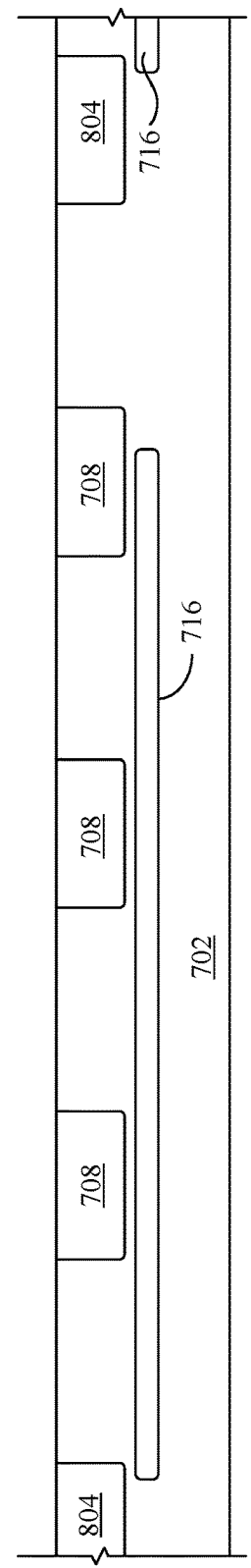

FIGS. 9A-9H show cross-sectional views, taken along section line A-A of FIG. 3B, which illustrate a process for manufacturing image sensor array 202 according to the present invention. In a first step shown in FIG. 9A, a p-type substrate 702 is provided. Substrate 702 could be a portion of a silicon wafer in which many arrays 202 will be fabricated, for example, using 55 nm or 45 nm processing techniques. Thereafter, as shown in FIG. 9B, a plurality of p-type deep barrier regions 716 are formed in substrate 702 via a known doping process such as ion implantation. Additionally, a plurality of p-type wells 708 and 804 are formed in silicon substrate 702 also using known implantation techniques, such as ion implantation.

Figure 9C:
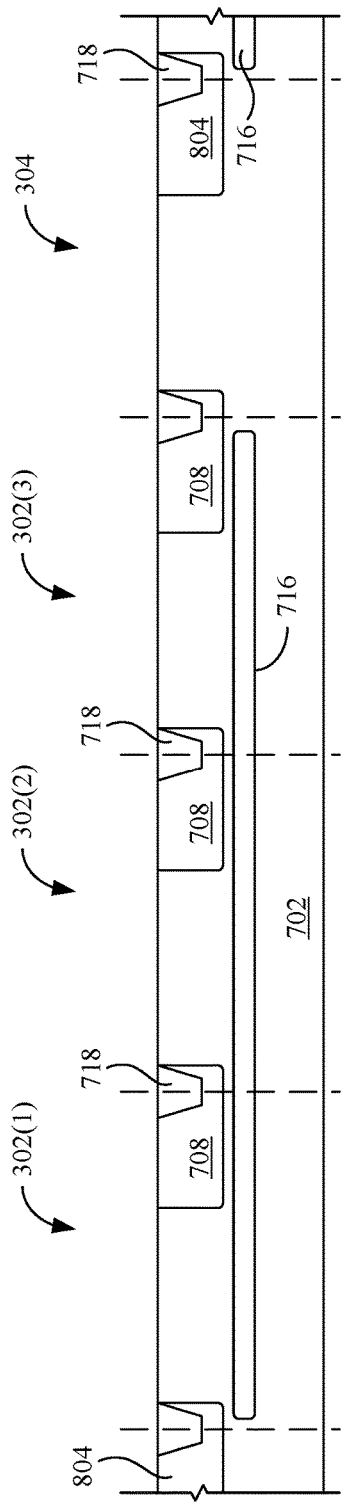
Figure 9D:
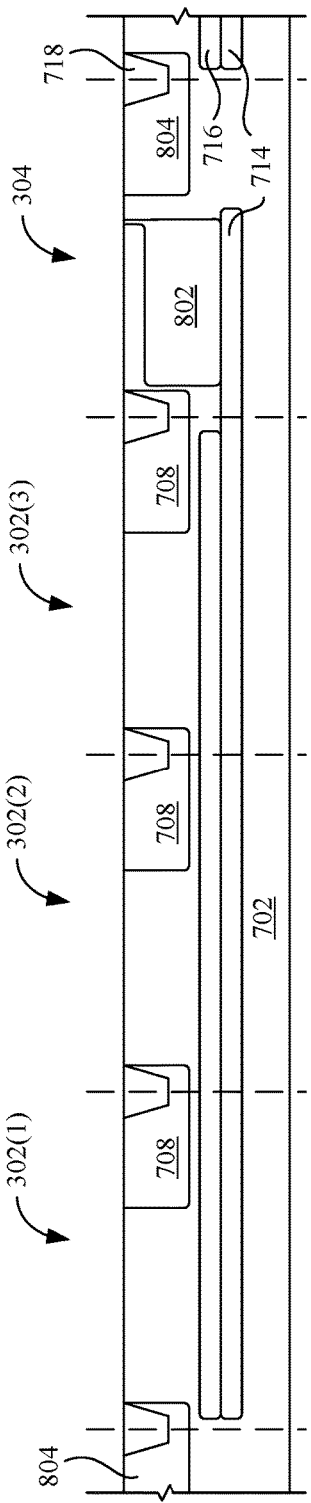

In a third step shown in FIG. 9C, a plurality of isolation regions 718 are formed in substrate 702, for example, by a shallow-trench isolation process. Vertical dashed lines are shown in FIG. 9C to delineate regions of substrate 702 associated with the adjacent color pixels 302(1-3) and infrared pixel 304 shown in FIG. 3B. FIG. 9D shows the formation of deep charge-accumulation regions 714 and of charge-accumulation regions 802 (only one region 802 is shown). These n-type regions can be formed using known ion implantation techniques at depths appropriate for detecting infrared light. Charge-accumulation regions 802 and 714 are shown separately in FIGS. 8 and 9, and therefore, they can be formed in distinct implantation processes and/or with different doping characteristics. However, it should be clear that, together, charge-accumulation regions 802 and 714 form one large n-type region.

Figure 9E:
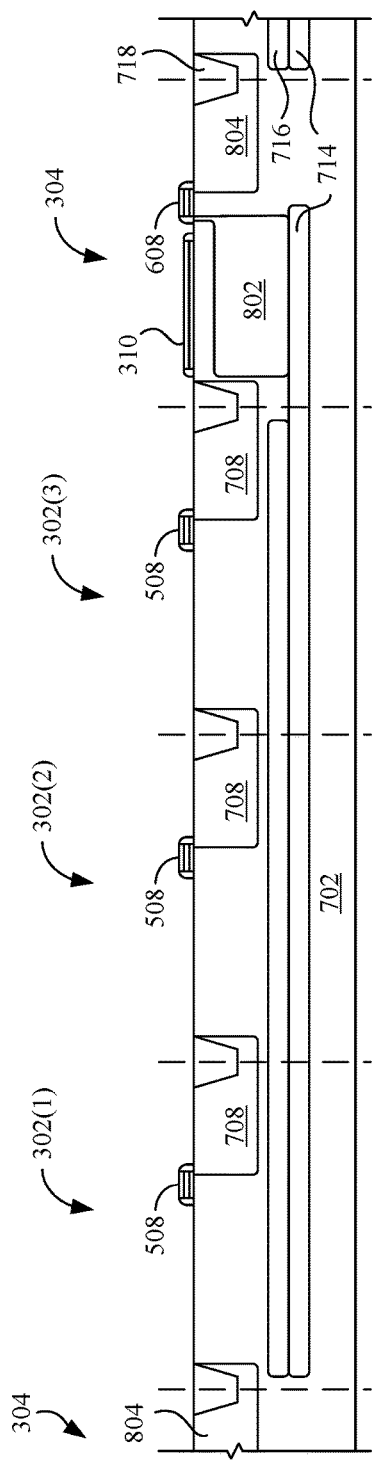

FIG. 9E shows transfer transistors 508 and 608 formed on substrate 702 for the color pixels 302 and infrared pixels 304, respectively. Additionally, FIG. 9E shows a photogate 310 formed over substrate 702 and above charge-accumulation region 802 for each infrared pixel 304 (only one photogate 310 is shown). FIG. 9E illustrates the importance of forming select regions of the pixels 302 and 304 prior to forming photogates 310 and transfer transistors 508 and 608. In particular, photogates 310 are formed from polysilicon, and transfer transistors 508 and 608 include polysilicon layers 712 and 818 in their respective gate stacks. Because these polysilicon elements block doping ions from being shot into substrate 702 during implantation, the barrier regions 716, the deep charge-accumulation regions 714, and the charge-accumulation regions 802 are formed prior to the photogates 310, the transfer transistors 508 and 608, and any other elements not shown that contain polysilicon and overly such implanted regions.

Figure 9F:
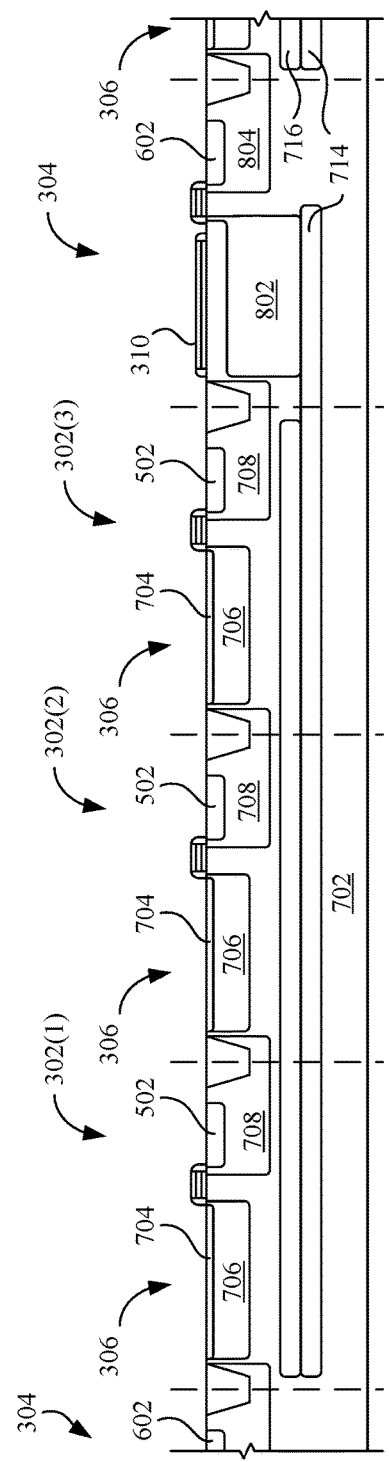

FIG. 9F illustrates pinned photodiodes 306 being formed for each of color pixels 302, as well as, floating diffusion regions 502 and 602 being formed for each pixel. In particular, n-type charge-accumulation regions 706 are formed for color pixels 302 in respective p-wells 708 at depths appropriate for detecting visible light. Additionally, n-type floating diffusion regions 502 and 602 are formed for color pixels 302 and infrared pixels 304, respectively, in the p-wells 708 and 804 as shown. Additionally, p-type pinning regions 704 are formed above each charge-accumulation region 706 for each pinned photodiode 502. It should be noted that the processes described in FIG. 9F could alternatively be performed before the formation of the polysilicon elements shown in FIG. 9E if desired or if necessary to facilitate ion implantation.

Figure 9G:
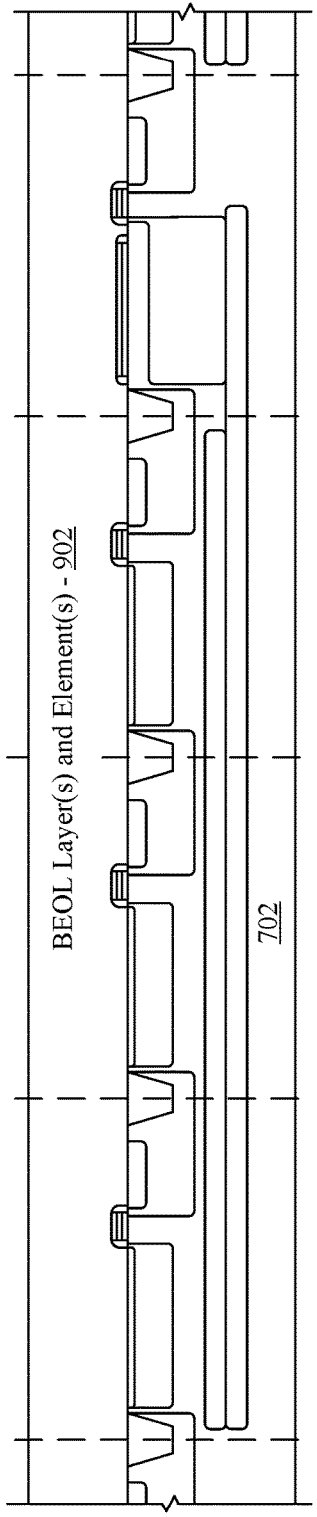
Figure 9H:
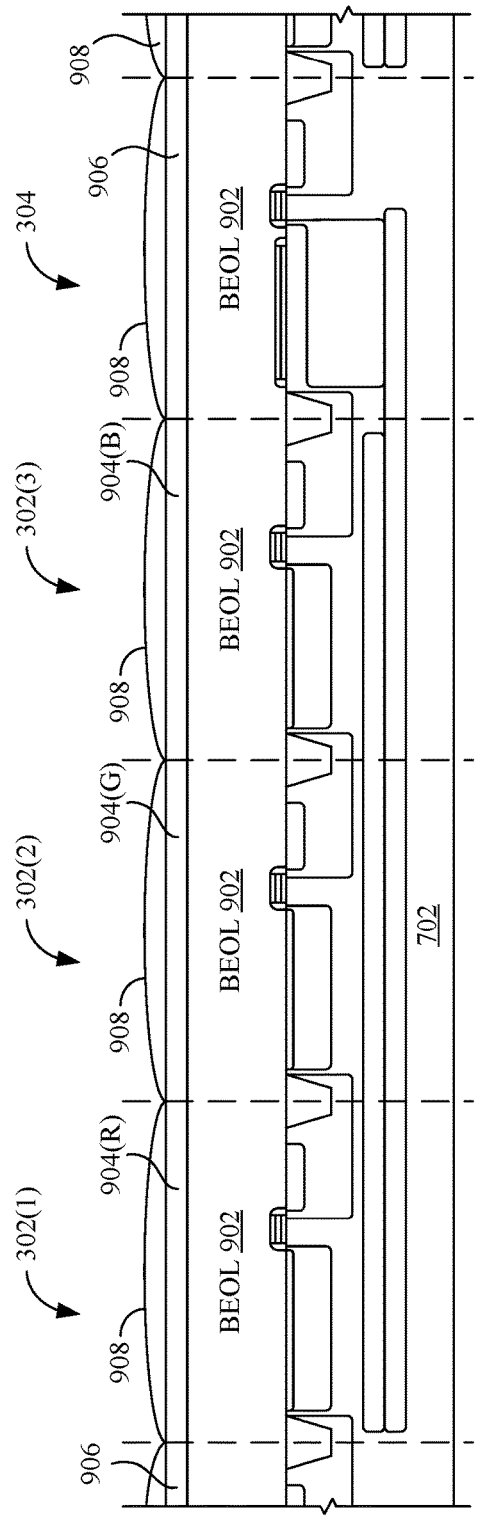

FIG. 9G shows the formation of various back-end of line (BEOL) layers and elements over substrate 702. The BEOL layers and elements are shown representationally as a single thick layer 902. However, those skilled in the art will understand that BEOL processing includes the formation of various layers (e.g., protective layers, insulating layers, metalization layers, etc.) and elements (vias, etc.) to complete and interconnect the integrated circuitry, for example by forming sets of row control lines 316 and 322. Because the formation of BEOL layers and elements 902 is not particularly relevant to the present invention, they are shown only representationally herein. Finally, in FIG. 9H, red, green, and blue color filters 904(R, G, B) are applied over the respective color pixels 302(1-3) of array and transparent filters or spacers 906 are applied over infrared pixels 304. Finally, micro-lenses 908 are formed to focus light on the photosensitive areas of pixels 302 and 304.

Methods of the present invention will now be described with reference to FIGS. 10-11. For the sake of clear explanation, these methods might be described with reference to particular elements of the previously-described embodiments. However, it should be noted that other elements, whether explicitly described herein or created in view of the present disclosure, could be substituted for those cited without departing from the scope of the present invention. Therefore, it should be understood that the methods of the present invention are not limited to any particular elements that perform any particular functions. Furthermore, some steps of the methods presented herein need not necessarily occur in the order shown. For example, in some cases two or more method steps may occur simultaneously. These and other variations of the methods disclosed herein will be readily apparent, especially in view of the description of the present invention provided previously herein, and are considered to be within the full scope of the invention.

Figure 10:
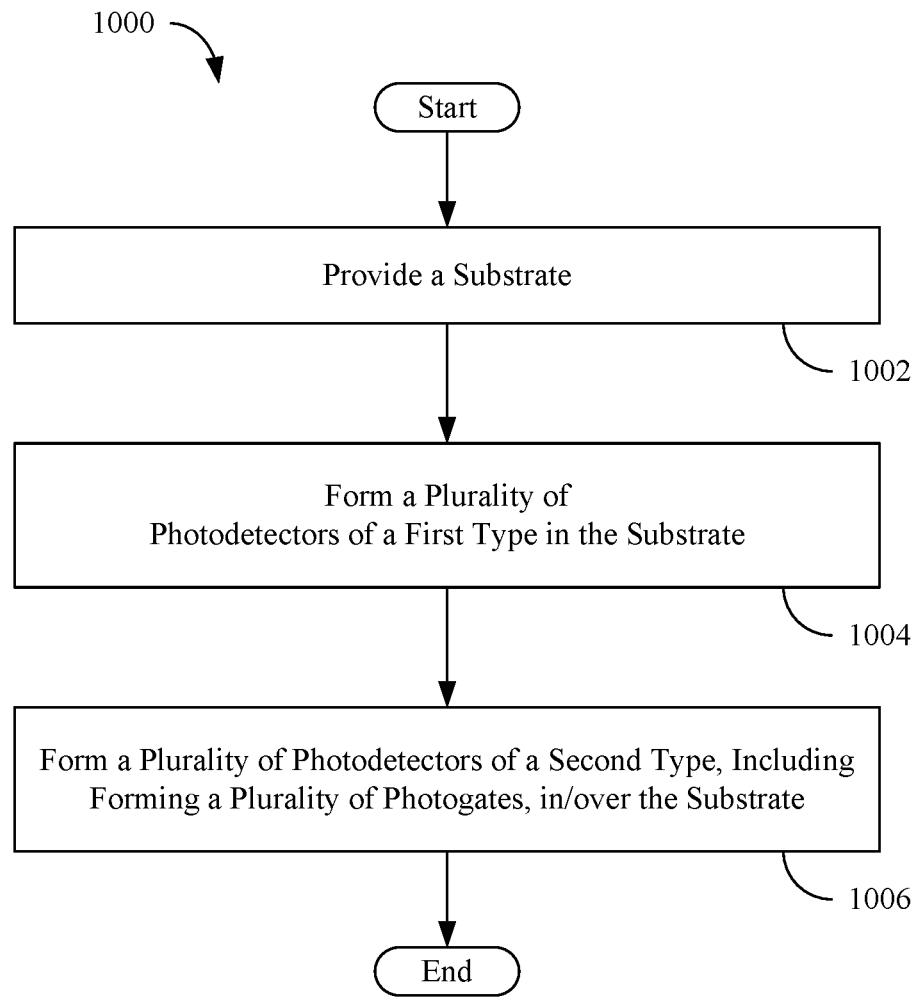
FIG. 10 is a flowchart summarizing a method of manufacturing an image sensor according to the present invention.

FIG. 10 is a flowchart summarizing a method 1000 of forming an image sensor according to the present invention. In a first step 1002, a substrate 702 (e.g., a silicon substrate) is provided. In a second step 1004, a plurality of photodetectors of a first type 306 are formed in the substrate such that each photodetector of the first type is configured to detect visible light and is associated with one of the first plurality of pixels. In a third step 1006, a plurality of photodetectors of a second type 308 are formed in the substrate such that each of the photodetectors of the second type is configured to detect infrared light and is associated with one of a second plurality of pixels. The third step 1006 also includes forming a plurality of photogates 310, where each photogate is associated with one of the photodetectors of the second type. The first plurality of pixels and the second plurality of pixels are arranged to define a sensor array 202 having a plurality of rows and a plurality of columns where pixels of the second plurality are dispersed among pixels of the first plurality.

Figure 11:
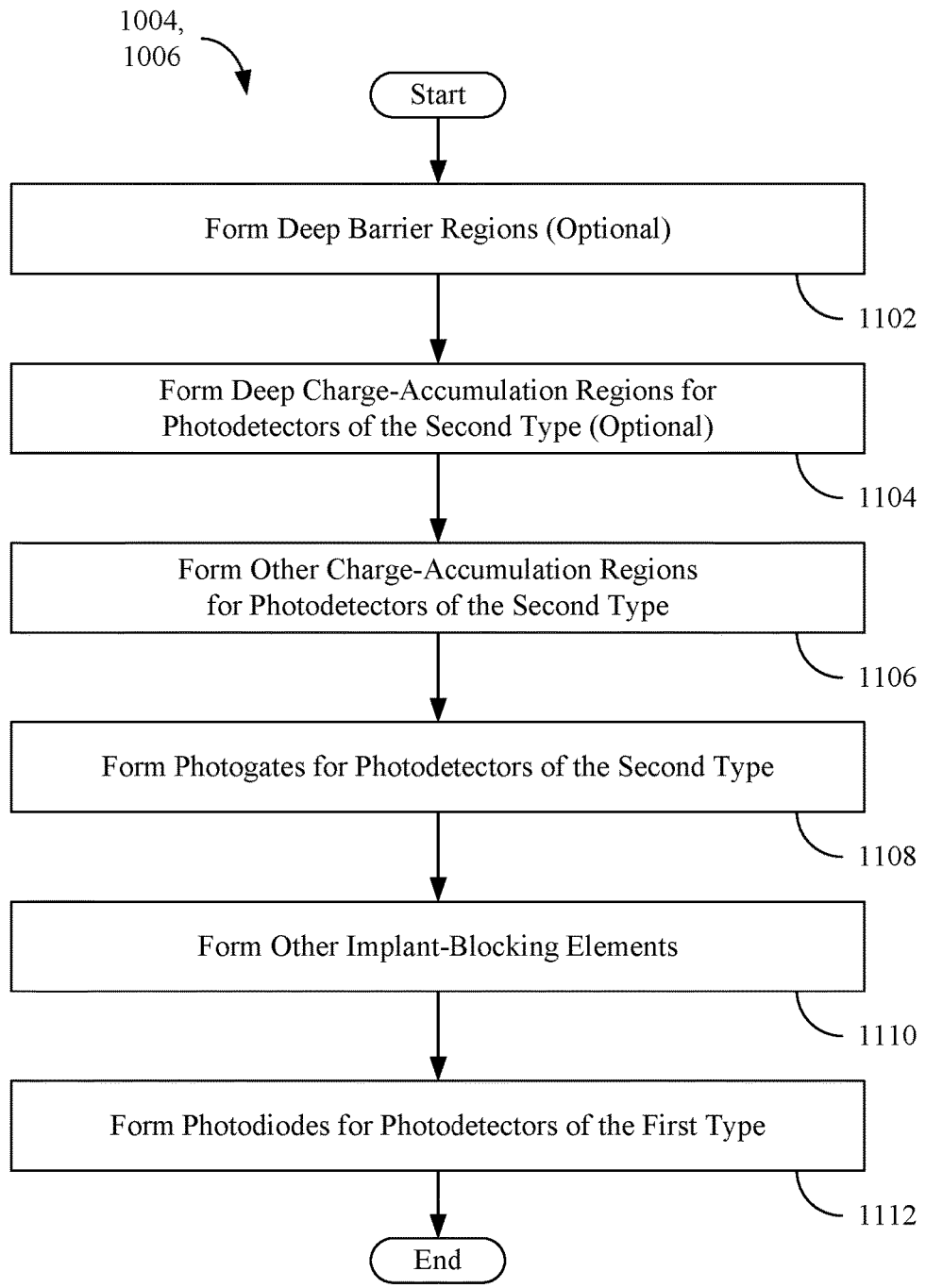
FIG. 11 is a flowchart summarizing a particular method for performing the second and third steps of the method of FIG. 10 according to the present invention.

FIG. 11 is a flowchart summarizing a particular method for performing the second step 1004 (form a first plurality of photodetectors) and the third step 1006 (form a second plurality of photodetectors) of method 1000 according to the present invention. In an optional first step 1102, a plurality of deep barrier regions 716 are formed (e.g., by ion implantation) in the substrate at locations below locations where the photodetectors of the first type will be formed. In an optional second step 1104, a plurality of deep charge-accumulation regions 714 are formed in the substrate (e.g., by ion implantation) below the deep barrier regions 716 and below locations in the substrate where the plurality of photogates 310 will be formed. In a third step 1106, a plurality of charge-accumulation regions 802 are formed in the substrate below locations where the plurality of photogates 310 will be formed for the photodetectors of the second type. In a fourth step 1108, the plurality of photogates 310 are formed over the substrate and above the charge-accumulation regions 802, and in a fifth step 1110 other implant-blocking elements (e.g., transfer transistors 508, 608, etc.) are formed on the substrate. Optionally, steps 1108 and 1110 can be performed simultaneously. In a sixth step 1112, the photodetectors of the first type are formed by forming a plurality of pinned photodiodes 520 in the substrate. Alternatively, sixth step 1112 can be performed prior to step 1108 and/or prior to step 1110. FIG. 11 illustrates the importance of forming particular doped regions (e.g., regions 802, 714, and 716) prior to forming the photogates 310 and any other implant-blocking elements, so that such elements do not block doping ions from being implanted.

The description of particular embodiments of the present invention is now complete. Many of the described features may be substituted, altered or omitted without departing from the scope of the invention. For example, alternative color and/or infrared pixel designs may be substituted for the designs shown. As another example, a deep charge-accumulation region 714 associated with an infrared pixel 304 might only underlie one neighboring color pixel or may be eliminated altogether. As yet another example, the photogate structure for the infrared pixels may be implemented in sensor arrays having only infrared pixels. As still another example, the deep charge-accumulation region 714 can be formed prior to forming the barrier region 716, the p-wells 708 and 804, and the isolation regions 718. These and other deviations from the particular embodiments shown will be apparent to those skilled in the art, particularly in view of the foregoing disclosure.

We claim:

1. An image sensor comprising:
a substrate;
a first plurality of pixels, said pixels of said first plurality including some elements formed on said substrate and other elements formed in said substrate;
a second plurality of pixels, said pixels of said second plurality including some elements formed on said substrate and other elements formed in said substrate; and wherein
said first plurality of pixels and said second plurality of pixels are arranged to define a sensor array having a plurality of rows and a plurality of columns, pixels of said second plurality being dispersed among said pixels of said first plurality in said sensor array;

each pixel of said first plurality includes a photodetector of a first type configured to detect light in the visible spectrum; and
each pixel of said second plurality includes a photodetector of a second type comprising, a photodiode formed in said substrate, a photogate formed over said substrate and above said photodiode along an axis perpendicular to said surface of said substrate, and a volume of said substrate between said photogate and said photodiode that is free of any implant, said photodetector of said second type being configured to detect infrared light; and wherein
said volume of said substrate that is free of any implant is defined by projecting the area of said photogate perpendicular to said axis into said substrate along said axis to a depth just above said photodiode of said photodetector of said second type.

2. The image sensor of claim 1, wherein:
said photodetector of said first type comprises a pinned photodiode including a first implant of a first type conductivity disposed below a surface of said substrate and a second implant of a second type conductivity opposite of said first type conductivity forming a charge-accumulation region disposed below said first implant along said axis perpendicular to said surface of said substrate.

3. The image sensor of claim 1, wherein said photodiode of said photodetector of said second type further comprises a deep charge-accumulation region.

4. The image sensor of claim 3, wherein:
said deep charge-accumulation region extends into at least one neighboring pixel of said first plurality of pixels; and
said deep charge-accumulation region is formed below said photodetector of said first type associated with said at least one neighboring pixel.

5. The image sensor of claim 4, further comprising a barrier region formed above portions of said deep charge-accumulation region located in said at least one neighboring pixel.

6. The image sensor of claim 1, wherein said photogate is coupled to a voltage supply having a potential in the range of −1.0V to −1.4V.

7. The image sensor of claim 1, wherein said photogate is formed from polysilicon.

8. The image sensor of claim 1, wherein said photogate is configured to diminish light in at least a portion of the visible spectrum more than said photogate diminishes infrared light.

9. The image sensor of claim 1, wherein:
said first plurality of pixels and said second plurality of pixels are formed in and on a front side of said substrate; and
said first plurality of pixels and said second plurality of pixels detect light incident on and penetrating into said front side of said substrate.

10. A method for manufacturing an image sensor, said method comprising:
providing a substrate;
forming a plurality of photodetectors of a first type, said photodetectors of said first type including some elements formed on said substrate and other elements formed in said substrate, each of said photodetectors of said first type being configured to detect light in the visible spectrum and being associated with one of a first plurality of pixels;
forming a plurality of photodetectors of a second type, said photodetectors of said second type including some elements formed on said substrate and other elements formed in said substrate, each of said photodetectors of said second type being configured to detect infrared light and being associated with one of a second plurality of pixels; and wherein said plurality of photodetectors of said first type and said plurality of photodetectors of said second type are arranged to define a sensor array having a plurality of rows and a plurality of columns, said plurality of photodetectors of said second type being dispersed among said plurality of photodetectors of said first type in said sensor array;

said step of forming said plurality of photodetectors of said second type comprises forming a plurality of photogates, each of said plurality of photogates being associated with one of said photodetectors of said second type and being formed over an area of said substrate associated with said one of said photodetectors of said second type;

said step of forming said plurality of photodetectors of said second type further comprises, prior to said step of forming said plurality of photogates, forming a plurality of photodiodes in said substrate below, along an axis perpendicular to said surface of said substrate, locations where said plurality of photogates will be formed, said photodiodes of said photodetectors of said second type being formed a spaced distance below said surface of said substrate, each of said plurality of photodiodes being associated with one of said photodetectors of said second type; and said plurality of photodetectors of said second type are each free of any implant formed in said substrate between said photodiode and said photogate.

11. The method of claim 10, wherein:

said step of forming said plurality of photodetectors of said first type comprises forming a plurality of pinned photodiodes in said substrate, each of said plurality of pinned photodiodes being associated with one of said photodetectors of said first type and including a first implant of a first type conductivity disposed below a surface of said substrate and a second implant of a second type conductivity opposite of said first type conductivity forming a charge-accumulation region disposed below said first implant along an axis perpendicular to said surface of said substrate.

12. The method of claim 10, wherein said step of forming said plurality of photodetectors of said second type further comprises, prior to said step of forming said plurality of photogates, forming a plurality of deep charge-accumulation regions in said substrate below locations associated with said plurality of photogates.

13. The method of claim 12, wherein:

each of said plurality of deep charge-accumulation regions extends into an area of said substrate associated with at least one neighboring photodetector of said plurality of photodetectors of said first type;

said step of forming said plurality of deep charge-accumulation regions further comprises forming said plurality of deep charge-accumulation regions prior to forming said photodetectors of said first type; and said step of forming said plurality of deep charge-accumulation regions further comprises forming said plurality of deep charge-accumulation regions below locations in said substrate intended for said photodetectors of said first type.

14. The method of claim 13, further comprising, prior to said step of forming said plurality of photogates, forming a plurality of deep barrier regions in said substrate at locations above said plurality of deep charge-accumulation regions and below said locations in said substrate intended for said photodetectors of said first type.

15. The method of claim 14, wherein said steps of forming said plurality of deep charge-accumulation regions and forming said plurality of deep barrier regions are performed prior to forming implant-blocking elements over said substrate.

16. The method of claim 10, further comprising electrically coupling each of said plurality of photogates to a voltage supply having a potential in the range of −1.0V to −1.4V.

17. The method of claim 10, wherein each of said plurality of photogates is formed from polysilicon.

18. The method of claim 10, wherein each of said plurality of photogates is configured to diminish light in at least a portion of the visible spectrum more than said photogate diminishes infrared light.

19. The method of claim 10, wherein:

said plurality of photodetectors of said first type and said plurality of photodetectors of said second type each include some elements formed in and other elements formed on a front side of said substrate; and said plurality of photodetectors of said first type and said plurality of photodetectors of said second type detect light incident on and penetrating into said front side of said substrate.

20. An image sensor comprising:

a substrate; and a plurality of infrared pixels each including some elements formed on and other elements formed in a front side of said substrate, said pixels being configured to detect infrared light incident on and penetrating into said front side of said substrate; and wherein each of said infrared pixels comprises a photodiode formed in said substrate a spaced distance below the surface of said front side of said substrate, a photogate formed over said surface of said front side of said substrate above said photodiode along an axis perpendicular to said surface of said front side of said substrate, and no implants below said surface of said front side of said substrate between said photodiode and said photogate.

21. The image sensor of claim 20, further comprising a plurality of color pixels dispersed among said infrared pixels, each of said color pixels comprising a pinned photodiode and being configured to detect light in the visible spectrum, said pinned photodiode including a first implant of a first type conductivity disposed immediately below said surface of said front side of said substrate and a second implant of a second type conductivity opposite said first type conductivity forming a charge-accumulation region disposed below said first implant along an axis perpendicular to said surface of said substrate.

22. The image sensor of claim 21, wherein said photodiode of each of said infrared pixels includes a deep charge-accumulation region underlying said pinned photodiode associated with at least one neighboring color pixel.

23. An image sensor comprising:

a substrate;

a first plurality of pixels, each pixel of said first plurality of pixels including some elements formed in said substrate and other elements formed on said substrate, said pixels of said first plurality of pixels being configured to detect light in the visible spectrum;

a second plurality of pixels, each pixel of said second plurality of pixels including some elements formed in said substrate and other elements formed on said substrate, said pixels of said second plurality of pixels being configured to detect infrared light; and wherein said first plurality of pixels and said second plurality of pixels are arranged to define a sensor array having a plurality of rows and a plurality of columns, pixels of said second plurality being dispersed among said pixels of said first plurality in said sensor array; and each pixel of said second plurality includes a photodetector and a means for biasing a region of said substrate over said photodetector to create a pinning effect without an implant and for diminishing light in at least a portion of the visible spectrum to a greater extent than infrared light.

24. The image sensor of claim 1, wherein said photodetector of said second type includes:

a charge-accumulation region disposed under said photogate along an axis perpendicular to the surface of said substrate, said charge-accumulation region extending continuously along said axis from a first depth in said substrate to a second depth deeper than said first depth; and a deep charge-accumulation region extending continuously along said axis from said second depth to a third depth deeper than said second depth, being in contact with said charge-accumulation region under said photogate along said axis, and extending in a direction parallel to said surface of said substrate to a region beneath said photodetector of said first type associated with said at least one neighboring pixel in a plan view.

25. The method of claim 10, wherein said step of forming said plurality of photodetectors of said second type includes:

forming a charge-accumulation region under said photogate and extending continuously along said axis from a first depth in said substrate to a second depth deeper than said first depth; and forming a deep charge-accumulation region extending continuously along said axis from said second depth to a third depth deeper than said second depth, being in contact with said charge-accumulation region under said photogate along said axis, and extending in a direction parallel to said surface of said substrate to a region beneath at least one adjacent photodetector of said first type in a plan view.

* * * * *